United States Patent
Cheng et al.

(10) Patent No.: US 12,453,176 B2
(45) Date of Patent: Oct. 21, 2025

(54) HETEROGENEOUS GATE ALL AROUND DIELECTRIC THICKNESS

(71) Applicant: INTERNATIONAL BUSINESS MACHINES CORPORATION, Armonk, NY (US)

(72) Inventors: Kangguo Cheng, Schenectady, NY (US); Ruilong Xie, Niskayuna, NY (US); Julien Frougier, Albany, NY (US); Chanro Park, Clifton Park, NY (US); Min Gyu Sung, Latham, NY (US)

(73) Assignee: International Business Machines Corporation, Armonk, NY (US)

( * ) Notice: Subject to any disclaimer, the term of this patent is extended or adjusted under 35 U.S.C. 154(b) by 517 days.

(21) Appl. No.: 17/932,557

(22) Filed: Sep. 15, 2022

(65) Prior Publication Data
US 2024/0096886 A1    Mar. 21, 2024

(51) Int. Cl.
*H10D 84/00* (2025.01)
*H01L 21/02* (2006.01)
(Continued)

(52) U.S. Cl.
CPC ..... *H10D 84/856* (2025.01); *H01L 21/02603* (2013.01); *H10D 30/014* (2025.01);
(Continued)

(58) Field of Classification Search
CPC ............... H10D 84/856; H10D 84/014; H10D 84/0179; H10D 84/0144; H10D 84/0181;
(Continued)

(56) References Cited

U.S. PATENT DOCUMENTS

| 10,014,389 B2 | 7/2018 | Xie |
| 10,243,054 B1 | 3/2019 | Cheng |
(Continued)

FOREIGN PATENT DOCUMENTS

CN    114388349 A    4/2022

OTHER PUBLICATIONS

Choe, et al., "Multigate Ferroelectric Transistor Design Toward 3-nm Technology Node." in IEEE Transactions on Electron Devices, vol. 68, No. 11, pp. 5908-5911, Nov. 2021, doi: 10.1109/TED.2021.3108477.

(Continued)

*Primary Examiner* — Reema Patel
(74) *Attorney, Agent, or Firm* — Matthew Zehrer

(57) ABSTRACT

A semiconductor includes a first GAA FET and second GAA FET. The second GAA FET includes a first gate dielectric and second gate dielectric within its gate structure. The first GAA FET includes just the first gate dielectric within its gate structure. The gate dielectric structure of the first GAA FET provides for a nominal or a lesser effective gate dielectric or gate dielectric resistance relative to an effective gate dielectric structure of the second GAA FET. The first GAA FET further includes a first gate conductor within its gate structure and the second GAA FET further includes the first gate conductor and a second gate conductor within its gate structure. The first gate conductor and the second gate conductor are separated by the second gate dielectric.

20 Claims, 15 Drawing Sheets

(51) Int. Cl.
 *H10D 30/01* (2025.01)
 *H10D 30/43* (2025.01)
 *H10D 30/67* (2025.01)
 *H10D 62/10* (2025.01)
 *H10D 64/27* (2025.01)
 *H10D 84/01* (2025.01)
 *H10D 84/03* (2025.01)
 *H10D 84/85* (2025.01)

(52) U.S. Cl.
 CPC ......... *H10D 30/43* (2025.01); *H10D 30/6735* (2025.01); *H10D 62/121* (2025.01); *H10D 64/514* (2025.01); *H10D 84/0167* (2025.01); *H10D 84/0181* (2025.01); *H10D 84/038* (2025.01)

(58) Field of Classification Search
 CPC ............. H10D 30/6735; H10D 30/501; H10D 30/019; H10D 62/121
 See application file for complete search history.

(56) References Cited

U.S. PATENT DOCUMENTS

| | | |
|---|---|---|
| 11,164,943 B2 | 11/2021 | Yang |
| 11,244,961 B2 | 2/2022 | You |
| 11,289,485 B2 | 3/2022 | Fukuzaki |
| 2016/0190148 A1 | 6/2016 | Chan et al. |
| 2017/0200738 A1* | 7/2017 | Kim ..................... H10D 30/014 |
| 2018/0294359 A1 | 10/2018 | Chen et al. |
| 2020/0083382 A1 | 3/2020 | Xu et al. |
| 2020/0381562 A1* | 12/2020 | Jung ..................... H10D 30/031 |
| 2021/0066452 A1* | 3/2021 | Liaw ..................... H10D 30/43 |
| 2021/0098589 A1 | 4/2021 | Cheng et al. |
| 2021/0408234 A1 | 12/2021 | Huang |

OTHER PUBLICATIONS

International Search Report and Written Opinion dated Oct. 23, 2023, for International Application No. PCT/IB2023/057494, filed Jul. 24, 2023.

* cited by examiner

500

```
┌─────────────────────────────────────────────────────────┐
│ Form first replacement gate structure (RGS) around first│─── 502
│  nanostructure stack. The first RGS includes first gate │
│  dielectric, work function conductor, and first gate    │
│  conductor                                              │
└─────────────────────────────────────────────────────────┘
                            ▼
┌─────────────────────────────────────────────────────────┐
│ Form second RGS around second nanostructure stack. The  │─── 504
│ second RGS includes first gate dielectric, work function│
│ metal, and first gate conductor                         │
└─────────────────────────────────────────────────────────┘
                            ▼
           ┌──────────────────────────────┐
           │   Form mask over first RGS   │─── 506
           └──────────────────────────────┘
                            ▼
┌─────────────────────────────────────────────────────────┐
│ Partially recess work function metal and first gate     │─── 508
│ conductor and retain first gate dielectric of second    │
│ RGS forming second RGS trench                           │
└─────────────────────────────────────────────────────────┘
                            ▼
              ┌──────────────────────┐
              │     Remove mask      │─── 510
              └──────────────────────┘
                            ▼
       ┌────────────────────────────────────────┐
       │ Form second gate dielectric over first │─── 512
       │                RGS                     │
       └────────────────────────────────────────┘
                            ▼
┌─────────────────────────────────────────────────────────┐
│ Form second gate dielectric over partially recessed     │
│ work function metal, over partially recessed first gate │─── 514
│ conductor, and over retained first gate dielectric of   │
│ second RGS                                              │
└─────────────────────────────────────────────────────────┘
                            ▼
       ┌────────────────────────────────────────┐
       │ Form second gate conductor over second │─── 516
       │   gate dielectric within second RGS    │
       │                trench                  │
       └────────────────────────────────────────┘
                            ▼
       ┌────────────────────────────────────────┐
       │ Form contact of first RGS and form     │─── 518
       │ source/drain contact of first source/  │
       │                drain                   │
       └────────────────────────────────────────┘
                            ▼
       ┌────────────────────────────────────────┐
       │ Form contact of second RGS and form    │─── 520
       │ source/drain contact of second source/ │
       │                drain                   │
       └────────────────────────────────────────┘
```

FIG. 15

HETEROGENEOUS GATE ALL AROUND DIELECTRIC THICKNESS

BACKGROUND

Various embodiments of the present application generally relate to semiconductor device fabrication operations and resulting devices. More specifically, the various embodiments relate to gate all around transistors that includes relatively heterogeneous gate dielectric thicknesses.

Conventional semiconductor devices, such as integrated circuits (ICs), or the like, incorporate planar field effect transistors (FETs) in which current flows through a semiconducting channel between a source and a drain, in response to a voltage applied to a control gate. The semiconductor industry strives to obey Moore's law, which holds that each successive generation of IC devices shrinks to half its size and operates twice as fast. As device dimensions have shrunk, however, conventional silicon device geometries and materials have experienced difficulty maintaining switching speeds without incurring failures such as, for example, leaking current from the device into the semiconductor substrate. Several new technologies emerged that allowed chip designers to continue shrinking transistor sizes.

One particularly radical technology change entailed re-designing the structure of the FET from a planar device to a three-dimensional (3D) device in which the semiconducting channel was replaced by a fin that extends out from the plane of the substrate. In such a device, commonly referred to as a FinFET, the control gate wraps around three sides of the fin to influence current flow from three surfaces instead of one. The improved control achieved with a 3D design results in faster switching performance and reduced current leakage. Building taller devices has also permitted increasing the device density within the same footprint that had previously been occupied by a planar FET.

The FinFET concept was further extended by developing a gate all-around FET, or GAA FET, in which the gate fully wraps around one or more channels for maximum control of the current flow therein. In the GAA FET, the channels can take the form of nanowire(s), sheet(s) that are isolated from the substrate. In the GAA FET the respective channel surfaces that are not in contact with the source and drain are in contact with and surrounded by the gate.

One challenge in GAA FET fabrication is to form thick gate dielectric transistors (a.k.a. EG FETs). This challenge arises due to finite and limited space (e.g., 10 nm or less) between vertical nanosheet channels, where such small spacing cannot accommodate a thick gate dielectric. For example, after depositing a thick gate dielectric which consists of a gate oxide (e.g., ~3 nm thick) and high-k dielectric (e.g., ~2 nm thick), the thick gate dielectric may pinch off the space between vertically adjacent nanosheet channels, leaving inadequate space for gate work function or other gate conductor material(s) therebetween.

SUMMARY

In an embodiment of the present disclosure, a semiconductor device is presented. The semiconductor device includes a substrate; a first gate all around field effect transistor (GAA FET), and a second GAA FET. The first GAA FET is upon the substrate and includes a plurality of first nanostructure channels and a first gate structure. The first gate structure includes a first gate dielectric around the plurality of first nanostructure channels and a first gate conductor over the first gate. The second GAA FET is also upon the substrate and includes a plurality of second nanostructure channels and a second gate structure. The second gate structure includes the first gate dielectric around the plurality of first nanostructure channels, the first gate conductor over the first gate dielectric, a second gate conductor over the first gate conductor, and a second gate dielectric between the first gate conductor and the second gate conductor.

The first GAA FET may further include a first gate spacer around the first gate structure and the second GAA FET may further include a second spacer around the second gate structure. The first gate dielectric may be between the first gate conductor and the first gate spacer within the first GAA FET. The first gate dielectric may be between the first gate conductor and the second gate spacer and the second gate dielectric may be between the second gate conductor and the second gate spacer within the second GAA FET.

The first gate structure may further include a first work function conductor between the first gate dielectric and the first gate conductor. The second gate structure may further include the first work function conductor between the first gate dielectric and the first gate conductor. The second gate dielectric may be between the first gate dielectric and the second gate conductor within the second GAA FET.

The first gate conductor may be configured to receive a first voltage and the gate conductor is configured to receive a second voltage, which is greater than the first voltage. The first gate structure may include a first current impedance from the second gate conductor to the plurality of second nanostructure channels and the second gate structure may include a second current impedance from the first gate conductor to the plurality of first nanostructure channels, which is greater than the first current impedance.

The plurality of first nanostructure channels may each have a first channel length and the plurality of second nanostructure channels may each have a second channel length, which is greater than the first channel length.

In an embodiment of the present disclosure, another semiconductor device is presented. The semiconductor device includes a substrate, a low voltage gate all around field effect transistor (SG GAA FET), and a high voltage gate all around field effect transistor (EG GAA FET). The SG GAA FET is upon the substrate and includes a plurality of first nanostructure channels and a first gate structure. The first gate structure includes a first gate dielectric around the plurality of first nanostructure channels and a first gate conductor over the first gate. The EG GAA FET is also upon the substrate and includes a plurality of second nanostructure channels and a second gate structure. The second gate structure includes the first gate dielectric around the plurality of first nanostructure channels, the first gate conductor over the first gate dielectric, a second gate conductor over the first gate conductor, and a second gate dielectric between the first gate conductor and the second gate conductor.

The SG GAA FET may further include a first gate spacer around the first gate structure and the EG GAA FET may further include a second spacer around the second gate structure. The first gate dielectric may be between the first gate conductor and the first gate spacer within the SG GAA FET. The first gate dielectric may be between the first gate conductor and the second gate spacer and the second gate dielectric may be between the second gate conductor and the second gate spacer within the EG GAA FET.

The first gate structure may further include a first work function conductor between the first gate dielectric and the first gate conductor. The second gate structure may further include the first work function conductor between the first gate dielectric and the first gate conductor. The second gate dielectric may be between the first gate dielectric and the second gate conductor within the EG GAA FET.

The first gate structure may have a first current impedance from the second gate conductor to the plurality of second nanostructure channels and the second gate structure may have a second current impedance from the first gate conductor to the plurality of first nanostructure channels greater than the first current impedance.

In another embodiment of the present disclosure, a semiconductor device fabrication method is presented. The method includes forming a plurality of first nanostructure channels between a first source and drain of a first gate all around field effect transistor (GAA FET). The method further includes forming a plurality of second nanostructure channels between a second source and drain of a second GAA FET. The method further includes forming a first gate dielectric around the plurality of first nanostructure channels of the first GAA FET and around the plurality second nanostructure channels of the second GAA FET. The method further includes forming a first gate conductor over the first gate dielectric of the first GAA FET and over the first gate dielectric of the second GAA FET. The method further includes partially recessing the first gate conductor of the second GAA FET and forming a second gate dielectric over the partially recessed first gate conductor of the second GAA FET. The method further includes forming a second gate conductor over the second gate dielectric of the second GAA FET.

In accordance with the embodiments of the disclosure, the second GAA FET or EG GAA FET includes the first gate dielectric and the second gate dielectric while the first GAA FET or SG GAA FET does not include the second gate dielectric. The second gate dielectric may be chosen to achieve a predetermined or desired voltage drop across the gate conductor that is over the nanolayer channels of the second GAA FET or EG GAA FET. In such implementations, current flow from this gate conductor into the nanolayer channels is impeded sequentially (i.e., in series) by both the second gate dielectric and the first gate dielectric. The impedance of this current flow and the overall resistive effect of the second gate dielectric and the first gate dielectric is greater than the overall resistive effect of merely the first gate dielectric of the first GAA FET or SG GAA FET. In this manner, the embodiments of the disclosure provide for nominal or a lesser effective gate dielectric or gate dielectric resistance within first GAA FET or SG GAA FET and an increased or higher effective gate dielectric or gate dielectric resistance within the second GAA FET or EG GAA FET. As such, embodiments of the disclosure provide fabrication methods and associated semiconductor structures with both the first GAA FET or SG GAA FET and the second GAA FET or EG GAA FET on the same substrate, wafer, or device layer.

These and other embodiments, features, aspects, and advantages will become better understood with reference to the following description, appended claims, and accompanying drawings.

BRIEF DESCRIPTION OF THE DRAWINGS

FIG. 15 is a flow diagram illustrating a semiconductor device fabrication method, in accordance with one or more embodiments of the disclosure.

DETAILED DESCRIPTION

Figure 1:
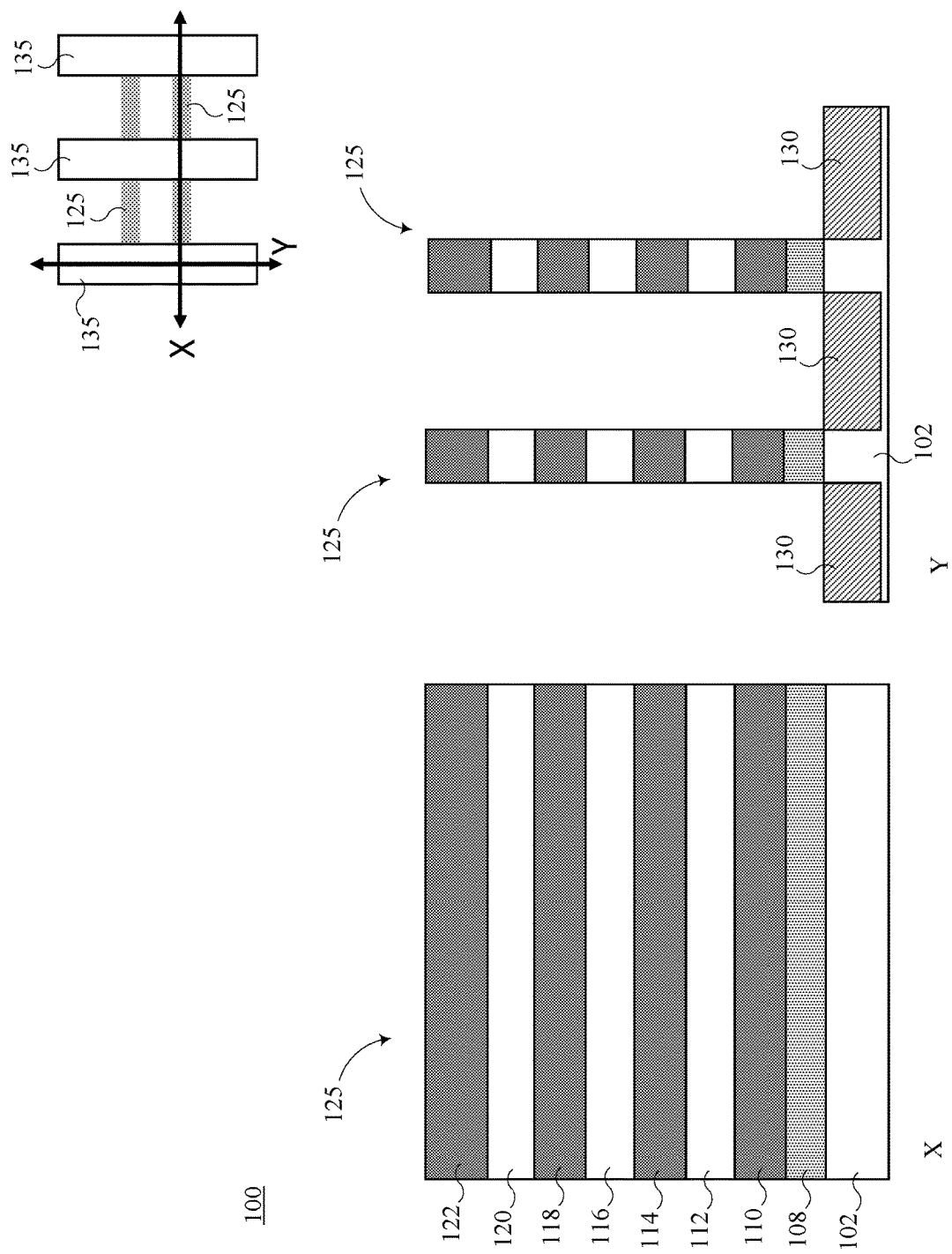
FIG. 1 through FIG. 8 depicts respective cross-sectional views of a semiconductor device that includes gate all around transistors shown after sequential fabrication operation(s), in accordance with one or more embodiments of the disclosure.

Embodiments of the disclosure recognize that not all GAA FETs within the same semiconductor device benefit from the same thickness of gate dielectric between the GAA channels and conductive gate material(s). As such, the present disclosure provides a fabrication method to form a semiconductor device that includes at least two GAA FETs with relatively different gate dielectric thicknesses. For example, a semiconductor device is formed to include a thick gate dielectric GAA FET (e.g., EG GAA FET) and to include a thin gate dielectric GAA FET (e.g., SG GAA FET).

The fabrication method may include recessing first conductor(s) of a first replacement gate structure of a first GAA FET and masking a second replacement gate structure of second GAA FET. For example, the gate conductor and work function material of the replacement gate structure the EG GAA FET is recessed, and the replacement gate structure of the SG GAA FET is masked. A first gate dielectric of the first replacement gate structure may be retained or may be recessed along with the first conductor(s).

The fabrication method may further include forming a second gate dielectric upon the first conductor(s) and upon the first gate dielectric. The fabrication method may further include forming second conductor(s) upon the second gate dielectric. The fabrication method may further include removing the mask of the second replacement gate structure of second GAA FET.

The fabrication method may result in the first GAA FET including the first replacement gate structure with an effectively thick gate dielectric and the second GAA FET including the second replacement gate structure with an effectively thin gate dielectric. The effectively thick gate dielectric of the first GAA FET may allow for high voltage operation of the first GAA FET with relatively improved gate dielectric reliability. Further, forming the effectively thick gate dielectric of the first GAA FET, in accordance with the embodiments, does not require forming a thick gate dielectric directly upon the nanosheet channels, which may result in the gate dielectric pinching off the space between vertically adjacent nanosheet channels. Therefore, forming the effectively thick gate dielectric of the first GAA FET, in accordance with the embodiments, may allow for adequate gate work function or other gate conductor material(s) to be formed between vertically adjacent nanosheet channels.

Although this detailed description includes examples of how embodiments of the disclosure can be implemented to form an exemplary semiconductor device with various GAA FETs, implementation of the teachings recited herein are not limited to a particular type of GAA FET structure or combination of materials depicted or described. Rather, embodiments of the present disclosure are capable of being implemented in conjunction with other transistor types or materials, now known or later developed, wherein it is desirable to provide for transistors with heterogenous gate dielectric thicknesses.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. Various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a semiconductor device that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional (3D) relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to generalities related to the embodiments, transistors are semiconductor devices commonly found in a wide variety of ICs. Typical semiconductor devices are formed using active regions of a wafer. The active regions are defined by isolation regions used to separate and electrically isolate adjacent semiconductor devices. For example, in an IC having a plurality of GAA FETs, each GAA FET has a source and a drain that are formed in an active region of a semiconductor layer by implanting n-type or p-type impurities in the respective source and the drain material. Disposed between the source and the drain is a channel (or body) region. Disposed around the channel is the gate. The gate and the channel are spaced apart by a dielectric layer.

GAA FETs may be fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of a GAA FET is related to the electrical conductivity of the channel material. If the channel material has a relatively high conductivity, the GAA FET can be made with a correspondingly smaller wafer footprint. A known method of increasing channel conductivity and decreasing GAA FET size is to form the channel as a nanostructure, such as a nanowire or nanosheet. These GAA FETs provide a relatively small FET footprint by forming the channel as a series of vertical nanostructures.

In a known GAA configuration, a nanostructure-based FET includes a source region, a drain region, and stacked nanostructure channels between the source and drain regions. A gate surrounds the stacked nanostructure channels and regulates electron flow through the nanostructure channels between the source and drain regions. GAA FETs may be fabricated by forming alternating layers of channel nanostructure and sacrificial nanostructure layers. The sacrificial nanostructure layers are released from the channel nanostructures before the GAA FET device is finalized. For n-type GAA FETs, the channel nanostructure layers may be silicon (Si) and the sacrificial nanostructure layers may be silicon germanium (SiGe). For p-type GAA FETs, in some implementations, the channel nanostructure layers may be SiGe and the sacrificial nanostructure layers may be Si and in other implementations, the channel nanostructure may be Si, and the sacrificial nanostructure can be SiGe.

Forming the GAA nanostructures from alternating layers of channel nanostructure layers formed from a first type of semiconductor material (e.g., Si for n-type FETs, and SiGe for p-type FETs) and sacrificial nanostructure layers formed from a second type of semiconductor material (e.g., SiGe for n-type FETs, and Si for p-type FETs) may provide for superior channel electrostatics control, which is beneficial for continuously scaling of CMOS technology.

Turning now to a more detailed description of fabrication operations and resulting structures according to embodiments of the disclosure, FIGS. 1-8 depict a semiconductor device 100 after various fabrication operations. For ease of illustration, the fabrication operations depicted in FIGS. 1-8 will be described in the context of forming one or more GAA FETs. The fabrication operations described herein apply equally to the fabrication of any number and/or logical positioning of various FET types.

Although the cross-sectional structural diagrams depicted in the drawings are two-dimensional (2D), it is understood that the diagrams depicted represent 3D devices. The top-down reference diagram shown in FIG. 1 provides a reference for various cross-sectional views (X-view, Y-view) shown in FIGS. 1-8. The X-view is a side cross-sectional view taken along a channel stack 125 across three (3) gates 135, the Y-view is another side cross-sectional view taken along one of the gates 135 across two of the channel stacks 125. For clarity, the gate 135 is depicted as a generic gate or gate structure and may be, for example, a sacrificial gate or sacrificial gate structure, a replacement gate conductor or replacement gate structure, or the like.

FIG. 1 depicts cross-sectional views of the semiconductor device 100 after initial fabrication operations in accordance with embodiments of the present disclosure. In the present fabrication stage, one or more channel stacks 125 are formed upon a substrate 102. Further in the present fabrication stage, shallow trench isolation (STI) region(s) 130 may be formed upon the substrate 102 next to the channel stacks 125.

Non-limiting examples of suitable materials for the substrate 102 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb). The substrate 102 can be a bulk semiconductor material that includes Si, multilayer substrate, such as a silicon on insulator (SOI) substrate, or the like.

A bottom sacrificial layer 108 may be formed upon the substrate 102. Subsequently, alternating nanostructure layers may be formed upon the bottom sacrificial layer 108. The bottom sacrificial layer 108 may be initially formed over the substrate 102. The bottom sacrificial layer 108 may comprise an epitaxial SiGe layer with high Ge %, ranging from 50% to 70%. In some embodiments of the disclosure, the bottom sacrificial layer 108 is SiGe having a Ge percentage that is sufficiently different from the Ge percentage in the sacrificial nanolayers, such that the bottom sacrificial layer 108 can be selectively removed without also removing the SiGe sacrificial nanolayers. The bottom sacrificial layer 108 can have a thickness of, for example, from about 4 to about 15 nm.

In some implementations, the bottom sacrificial layer 108 may be omitted and the channel stacks 125 may be formed directly upon a top surface of the substrate 102.

The channel stack 125 may include portions formed of an alternating series of sacrificial nanolayers, such as SiGe sacrificial nanolayers, and portions of nanolayers, such as Si nanolayers. The sacrificial SiGe nanolayers could have lower Ge % ranging from 20% to 45%. Sacrificial portions 110, 114, 118, and 122 of each of the channel stacks 125 may be formed from an associated sacrificial nanolayer and nanostructure channels 112, 116, and 120 of each of the channel stacks 125 may be formed from an associated nanolayer.

In accordance with embodiments of the disclosure, the bottom sacrificial layer 108 may be epitaxially grown from the substrate 102 and the alternating nanolayers may be formed by epitaxially growing one layer and then the next until the desired number and desired thicknesses of the layers are achieved. Any number of alternating layers can be provided. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a (100) orientated crystalline surface will take on a (100) orientation. In some embodiments, epitaxial growth and/or deposition processes are selective to forming on semiconductor surfaces, and generally do not deposit material on exposed surfaces, such as silicon dioxide or silicon nitride surfaces.

In some embodiments of the disclosure, the nanolayers are formed from silicon (Si) and can include, for example, monocrystalline Si. The nanolayers can have a thickness of, for example, from about 4 to about 12 nm. In embodiments where the sacrificial nanolayers include SiGe, the sacrificial nanolayers can have a thickness of, for example, from about 4 to about 12 nm. Subsequently, a mask layer (not shown) may be formed upon the top of the uppermost sacrificial nanolayer.

At the present fabrication stage, each of the channel stacks 125 may include a bottom sacrificial portion 108, a sacrificial nanolayer portion 110, a nanostructure channel 112, a sacrificial nanolayer portion 114, a nanostructure channel 116, a sacrificial nanolayer portion 118, a nanostructure channel 120, and a sacrificial nanolayer portion 122. The channel stacks 125 may be formed by patterning the associated layers, or portions thereof.

The one or more channel stacks 125 may be patterned by removing respective undesired portion(s) or section(s) of the aforementioned layers while retaining respective desired portions. The removal of undesired portions of the bottom sacrificial layer and the alternating sacrificial nanolayers and nanolayers can be accomplished using, for example, conventional lithography and etch process. The removal of such undesired portions may further remove undesired portions of the substrate 102, as depicted. Desired portions of bottom sacrificial layer and the alternating sacrificial nanolayers and nanolayers may be retained, thereby forming the one or more channel stacks 125.

Subsequently, STI regions 130 may be formed over the substrate 102 and adjacent to the one or more channel stacks 125. The STI regions 130 may be formed by depositing STI dielectric material upon the substrate 102 and adjacent to the channel stacks 125, followed by STI dielectric material etch back, recess, or the like. The STI regions 130 may electrically isolate components or features of neighboring GAA FETs, or the like. In the embodiment depicted, a top surface of the one or more STI regions 130 may be coplanar with a bottom surface of bottom sacrificial portion(s) 108 of one or more channel stacks 125.

Figure 2:
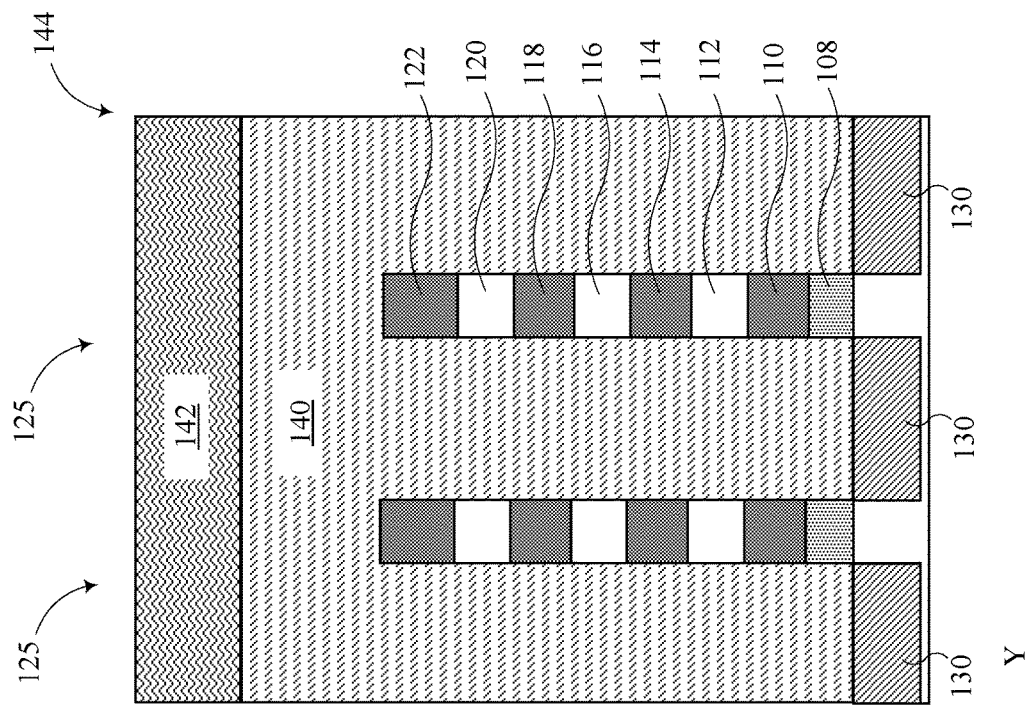
Figure 2:
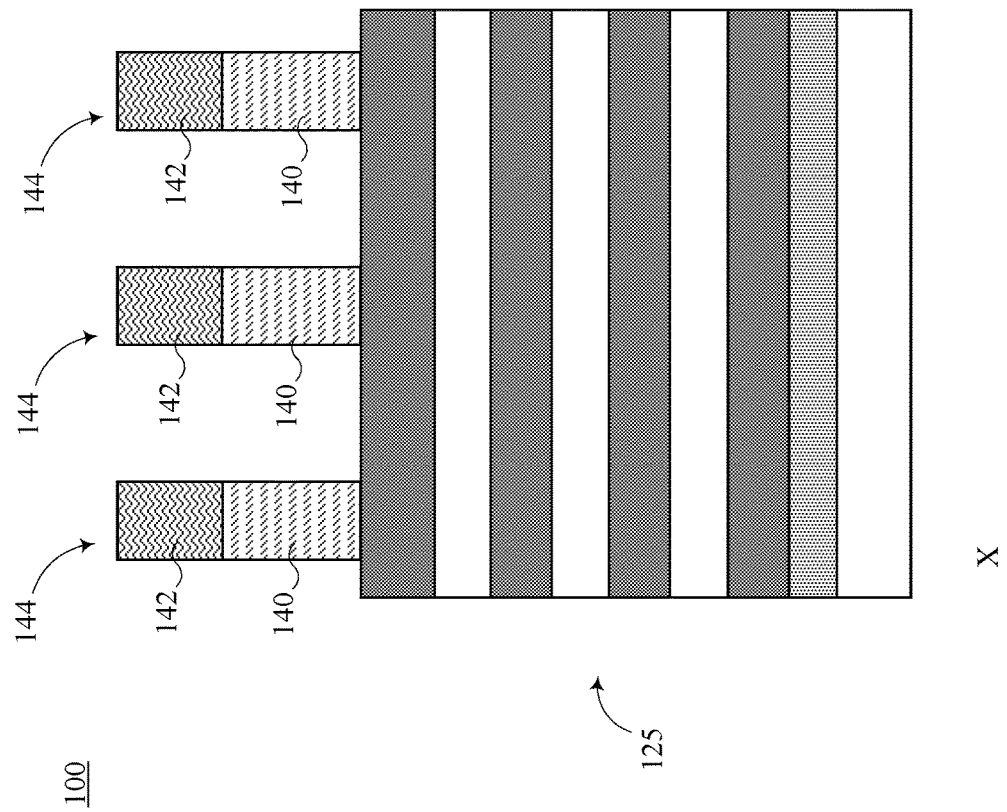

FIG. 2 depicts cross-sectional views of the semiconductor device 100 shown after exemplary fabrication operation(s), in accordance with one or more embodiments. In the depicted fabrication stage, one or more sacrificial gate structures 144 are formed upon and around the one or more channel stacks 125 and upon the STI regions 130. Sacrificial gate structure 144 may include a sacrificial gate liner (not shown), a sacrificial gate 140, and a sacrificial gate cap 142.

The sacrificial gate structure 144 may be formed by forming a sacrificial gate liner layer (e.g., a dielectric, oxide, or the like) upon the STI regions 130 and upon and around the channel stacks 125. For instance, the sacrificial gate liner layer may be deposited upon the upper surface of the STI regions 130, sidewalls of bottom sacrificial portion 108, sidewalls of sacrificial nanolayer portion 110, sidewalls of nanostructure channel 112, sidewalls of sacrificial nanolayer portion 114, sidewalls of nanostructure channel 116, sidewalls of sacrificial nanolayer portion 118, sidewalls of nanostructure channel 120, and sidewalls and upper surface of sacrificial nanolayer portion 122.

The sacrificial gate structure 144 may further be formed by subsequently forming a sacrificial gate layer (e.g., amorphous silicon, or the like) upon the sacrificial gate liner. The thickness of the sacrificial gate layer may be greater than the height of the one or more channel stacks 125.

The sacrificial gate structure 144 may further be formed by subsequently forming a gate cap layer upon the sacrificial gate layer. The gate cap layer may be formed by depositing a mask material, such as a hard mask material. The gate cap layer may be composed of one or more layers masking materials to protect the sacrificial gate layer and/or other underlying materials during subsequent processing of the semiconductor device 100. The gate cap layer can be formed of known gate mask materials such as silicon nitride, silicon oxide, combinations thereof, or the like.

The gate cap layer, sacrificial gate layer, and sacrificial gate liner may be patterned using conventional lithography and etch process to remove undesired portions and retain desired portion(s), respectively. The retained desired portion(s) of the gate cap layer, sacrificial gate layer, and sacrificial gate liner may form the sacrificial gate liner (not shown), the sacrificial gate 140, and the sacrificial gate cap 142, respectively, of each of the one or more sacrificial gate structures 144.

Each sacrificial gate structure 144 can be formed on targeted regions or areas of the semiconductor device 100 to define the length of one or more GAA FETs, one or more GAA FET channels, or the like, and to provide sacrificial material for yielding targeted GAA FET structure(s) in subsequent processing. According to an example, each sacrificial gate structure 144 can have a height of between approximately 50 nm and approximately 200 nm, and a length of between approximately 15 nm and approximately 200 nm.

Figure 3:
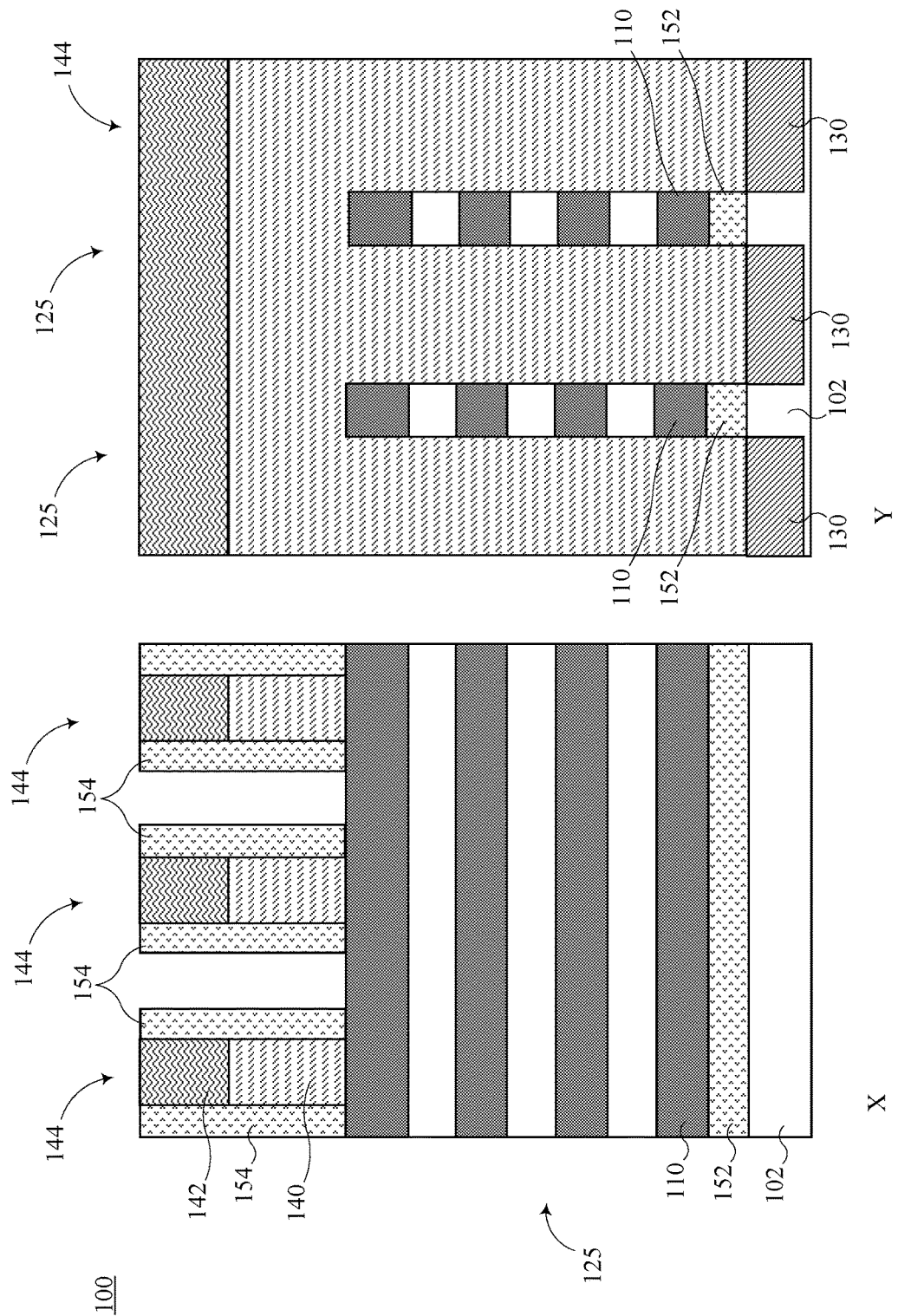

FIG. 3 depicts cross-sectional views of the semiconductor device 100 shown after exemplary fabrication operation(s), in accordance with one or more embodiments. In the depicted fabrication stage, bottom sacrificial portion 108 may be selectively removed, a bottom dielectric isolation (BDI) region 152 may be formed in place thereof, and one or more gate spacers 154 may be formed.

Bottom sacrificial portion 108 may be selectively removed and may resultantly form an associated BDI cavity between the substrate 102 and sacrificial nanolayer portion 110, respectively. In place of the removed bottom sacrificial portion 108, the BDI region 152 may be formed between the substrate 102 and sacrificial nanolayer portion 110 within each of the channel stacks 125.

Further in the depicted fabrication stage, a gate spacer 154 may formed around each of the one or more sacrificial gate structures 144. Each gate spacer 154 may further be formed upon at least a portion of the sidewalls of the one or more channel stacks 125 and upon the top surface of a portion of the STI regions 130.

The BDI region 152 and the gate spacers 154 may be simultaneously formed by a conformal deposition of a dielectric material, such as silicon nitride, SiBCN, SiNC, SiN, SiCO, SiNOC, or a combination thereof, or the like, within the BDI cavitie(s) and upon the STI regions 130 and around each of the one or more sacrificial gate structures 144. Undesired portion(s) of the dielectric material may be removed by etching or other subtractive material removal process. Desired portion(s) of the dielectric material may be retained within the BDI cavity and may form the BDI region(s) 152. Further additional desired portion(s) of the dielectric material may be retained upon the top surface of the STI regions 130 adjacent to and upon the sidewalls of the sacrificial gate structure 144 and around the one or more channel stacks 125.

Figure 4:
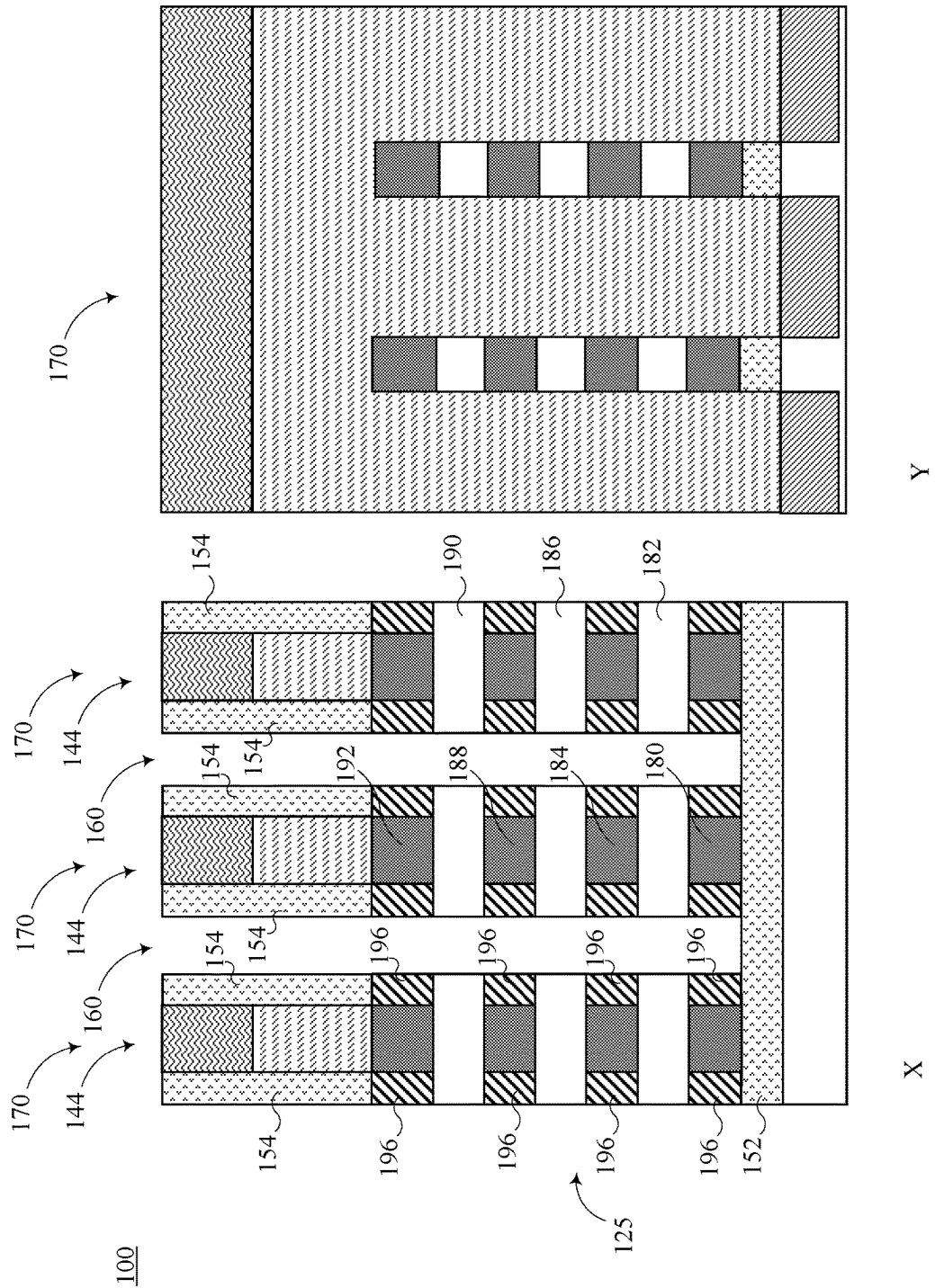

FIG. 4 depicts cross-sectional views of the semiconductor device 100 shown after exemplary fabrication operation(s), in accordance with one or more embodiments. In the depicted fabrication stage, one or more source/drain (S/D) recesses 160 and one or more nanostructure stacks 170 are formed.

The one or more S/D recesses 160 and the one or more nanostructure stacks 170 may be formed by recessing or otherwise removing at least one respective portion of the one or more channel stacks 125 that are not protected by the sacrificial gate structure 144 and/or the gate spacer 154. For example, unprotected and/or undesired portions of each of the channel stacks 125 may be etched or otherwise removed. The etch may utilize the top surface of the BDI region 152 as an etch stop. The retained one or more portions of the channel stack 125 may effectively form the one or more nanostructure stacks 170.

At the present fabrication stage, the nanostructure stack 170 may include a sacrificial nanolayer portion 180 formed from the sacrificial nanolayer portion 110 (see FIG. 3), a nanostructure channel 182 formed from the nanostructure channel 112 (see FIG. 2), a sacrificial nanolayer portion 184 formed from the sacrificial nanolayer portion 114 (see FIG. 2), a nanostructure channel 186 formed from the nanostructure channel 116 (see FIG. 2), a sacrificial nanolayer portion 188 formed from the sacrificial nanolayer portion 118 (see FIG. 2), a nanostructure channel 190 formed from the nanostructure channel 120 (see FIG. 2), and a sacrificial nanolayer portion 192 formed from the sacrificial nanolayer portion 122 (see FIG. 2).

The one or more nanostructure stacks 170 may be further modified or fabricated by selectively recessing the length or otherwise laterally indenting the sacrificial nanolayer portions 180, 184, 188, 192, etc. This lateral recessing of the sacrificial nanolayer portions 180, 184, 188, 192 can be provided, e.g., vapor-phase process, which leaves other structures (e.g., the substrate 102, the BDI region 152, the gate spacer 154, the nanostructure channels 182, 186, 190, etc.) substantially intact.

Inner spacers 196 may be formed within the indentations or lateral recess of the sacrificial nanolayer portions 180, 184, 188, 192. The inner spacers 196 may be formed by depositing an electrically insulative material, such as a dielectric, to pinch off the previously formed recesses to yield one inner spacer 196 positioned therewithin, (e.g., above and below each of the nanostructure channels 182, 186, 190 within the nanosheet stack 170). For example, one inner spacer 196 can be formed upon the sidewall of the sacrificial nanolayer portion 180 and between the BDI region 152 and the nanostructure channel 182, one inner spacer 196 can be formed upon the sidewall of sacrificial nanolayer portion 184 and between the nanostructure channel 182 and the nanostructure channel 186, one inner spacer 196 can be formed upon the sidewall of the sacrificial nanolayer portion 188 and between the nanostructure channel 186 and the nanostructure channel 190, and one inner spacer 196 can be formed upon the sidewall of the sacrificial nanolayer portion 192 and between the nanostructure channel 190 and the gate spacer 154. At the present fabrication stage, the nanostructure stack 170 may further include the inner spacers 196.

Figure 5:
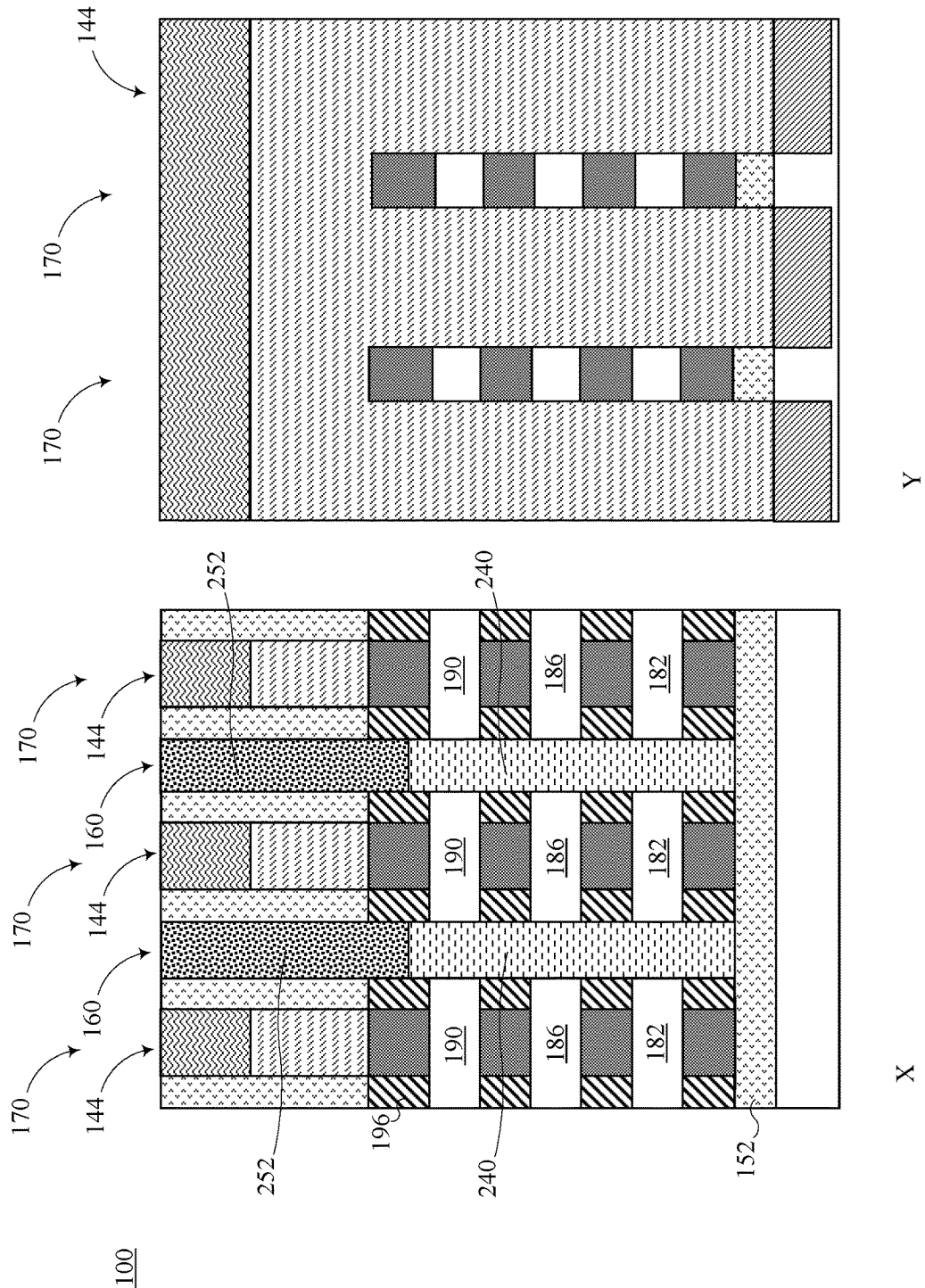

FIG. 5 depicts cross-sectional views of the semiconductor device 100 shown after exemplary fabrication operation(s), in accordance with one or more embodiments. In the depicted fabrication stage, a S/D region 240 is formed in the one or more S/D recesses 160, respectively and a S/D cap 252 is formed on the one or more S/D regions 240, respectively.

The S/D region 240 may be formed by epitaxially growing a source/drain epitaxial region within the S/D recess 160, e.g., from exposed inner sidewalls within the S/D recess 160. In some embodiments, the S/D region 240 is formed by in-situ doped epitaxial growth. In some embodiments, epitaxial growth and/or deposition processes may be selective to forming on semiconductor surfaces, and may not deposit material on dielectric surfaces, such as silicon dioxide or silicon nitride surfaces. In some embodiments, the S/D region 240 epitaxial growth may overgrow above the upper surface of the semiconductor device 100.

Suitable n-type dopants include but are not limited to phosphorous (P), and suitable p-type dopants include but are not limited to boron (B). The use of an in-situ doping process is merely an example. For instance, one may instead employ an ex-situ process to introduce dopants into the source and drains. Other doping techniques can be used to incorporate dopants in the bottom source/drain region. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In preferred embodiments, the S/D epitaxial growth conditions that promote in-situ Boron doped SiGe for p-type transistor and phosphorus or arsenic doped silicon or Si:C for n-type transistors. The doping concentration in the S/D region 240 can be in the range of $1\times10^{19}$ cm$^{-3}$ to $2\times10^{21}$ cm$^{-3}$, or preferably between $2\times10^{20}$ cm$^{-3}$ to $7\times10^{20}$ cm$^{-3}$.

In certain implementations, the S/D region 240 may be partially recessed such that an upper portion of the S/D region 240 are removed. For example, the upper portion of the one or more S/D regions 240 may be etched or otherwise removed. The etch may be timed or otherwise controlled to stop the removal of the one or more S/D regions 240 such that the top surface of the remaining one or more S/D regions 240 is above the upper surface of nanostructure channel 190. The partial removal of the upper portion of the S/D region 240 may at least partially reform the S/D recess 160.

The S/D cap 252 may be formed on the one or more S/D regions 240 within the partially reformed S/D recess 160, respectively. The S/D cap 252 may be formed by depositing a dielectric material, such as silicon nitride, SiBCN, SiNC, SiN, SiCO, SiNOC, or a combination thereof, or the like, within the partially reformed S/D recess 160 and upon S/D region 240. In an embodiment, the S/D cap 252 may be formed to a thickness above the top surface of the semiconductor device 100 and subsequently etched back such that the top surface of the S/D cap 252 is coplanar with a top surface of the sacrificial gate structure 144 and/or a top surface of gate spacer 152. The S/D cap 252 may also be referred to herein as a S/D insulator. In some implementations, The S/D cap 252 may also be referred to as an interlayer dielectric (ILD).

Figure 6:
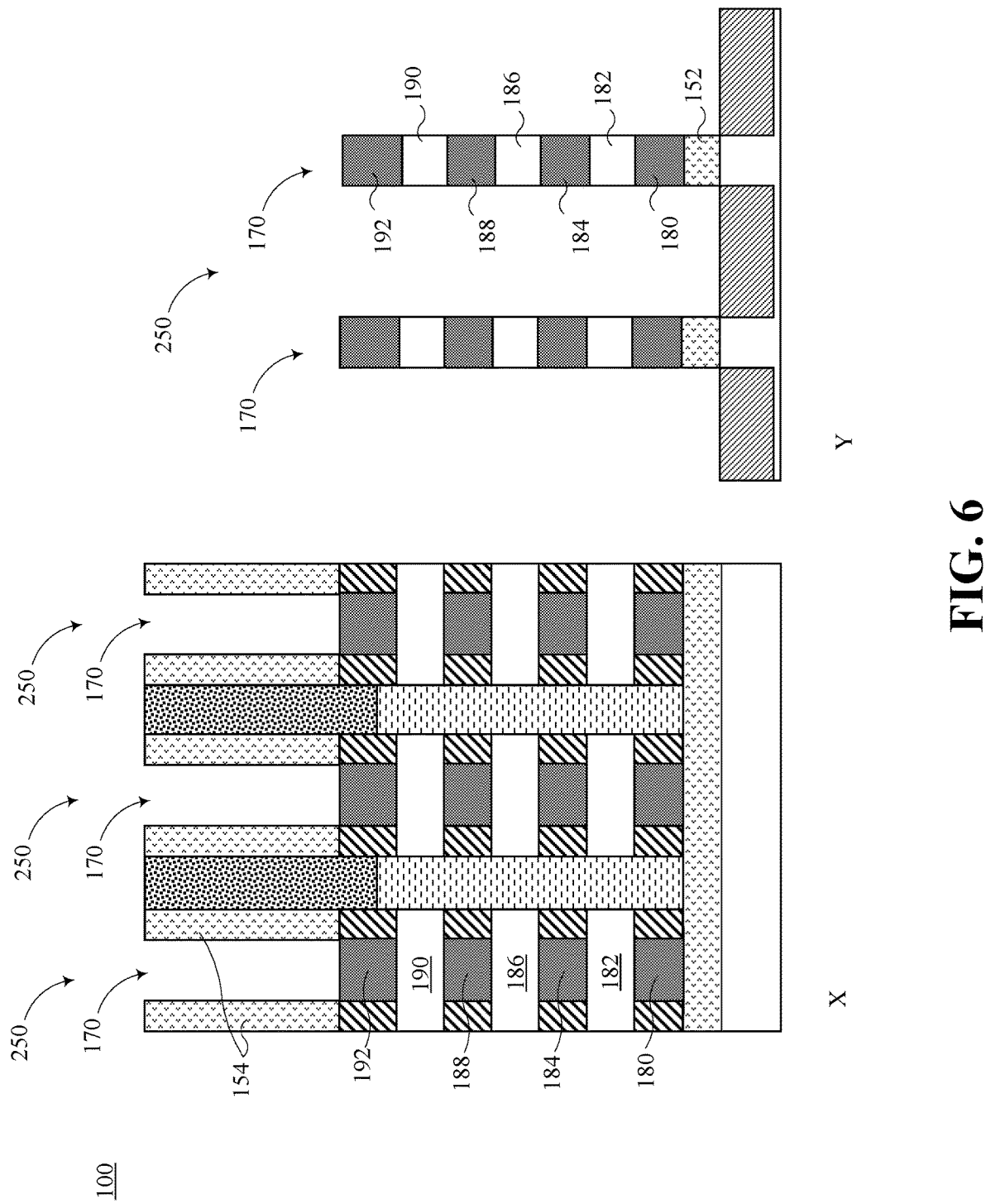

FIG. 6 depicts cross-sectional views of the semiconductor device 100 shown after exemplary fabrication operation(s), in accordance with one or more embodiments. In the depicted fabrication stage, a gate opening 250 is formed.

The gate opening 250 may be formed by removing sacrificial gate structure 144 and, as depicted in the Y cross-sectional view, may expose at least respective sections of the upper surface of the STI regions 130, respective sidewall surface sections of the BDI region 152, respective sidewall surface sections of the sacrificial nanolayer portions 180, 184, and 188, and 192, and respective sidewall surface sections of the nanolayer channels 182, 186, and 190.

Figure 7:
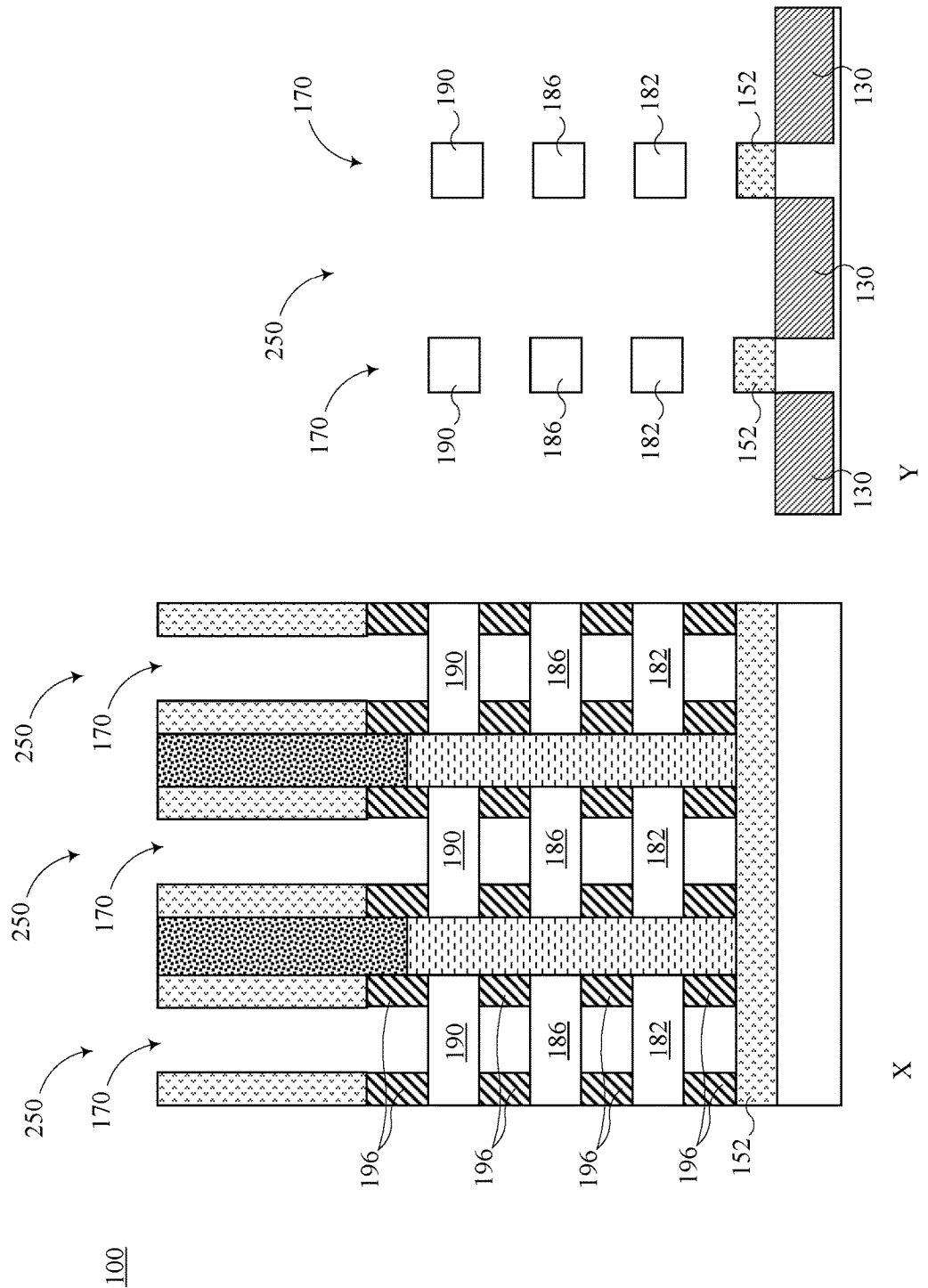

FIG. 7 depicts cross-sectional views of the semiconductor device 100 shown after exemplary fabrication operation(s), in accordance with one or more embodiments. In the depicted fabrication stage, the nanostructure stack 170 is modified by selectively removing the sacrificial nanolayer portions 180, 184, 188, and 192.

Various techniques may be utilized to process the nanostructure stack 170. For example, the gate opening 250 may laterally, or otherwise, expose the nanostructure stack 170. Subsequently, the exposed sacrificial nanolayer portions 180, 184, 188, and 192 may be removed to expose the nanolayer channels 182, 186, and 190 within the nanostructure stack 170. As depicted in the X cross-section, upper and lower surfaces of the nanolayer channels 182, 186, and 190 may be exposed inside or within neighboring the inner spacers 196 associated with neighboring nanostructure stacks 170. As depicted in the Y cross-section, the perimeter of the nanolayer channels 182, 186, and 190 may be exposed inside or within the neighboring inner spacers 196 associated with the neighboring nanostructure stacks 170.

Figure 8:
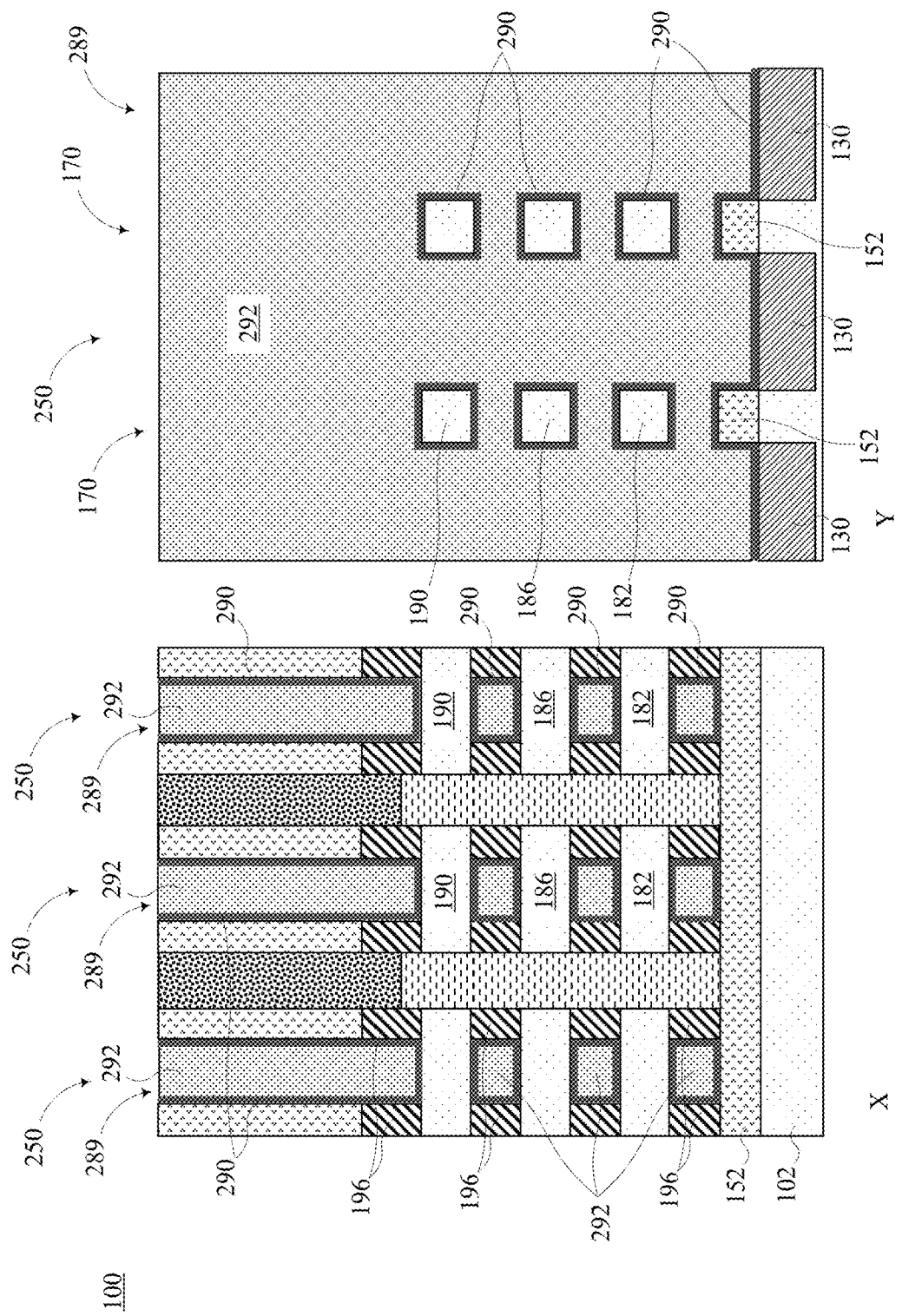

FIG. 8 depicts cross-sectional views of the semiconductor device 100 shown after exemplary fabrication operation(s), in accordance with one or more embodiments. In the depicted fabrication stage, a replacement gate structure 289 is formed within gate opening 250 around the nanolayer channels 182, 186, and 190.

The replacement gate structure 289 can include a gate dielectric 290 and gate conductor 292. The gate dielectric 290 can comprise any suitable dielectric material, including but not limited to silicon oxide, silicon nitride, silicon oxynitride, high-k materials, or any combination of these materials. The gate dielectric 290 can be formed by any suitable deposition process or the like. In some embodiments, the gate dielectric 290 has a thickness ranging from 1 nm to 5 nm, although less thickness and greater thickness are also conceived.

A gate conductor 292 can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g., Ti3Al, ZrAl), TaC, TaMgC, carbon nanotube, conductive carbon, graphene, or any suitable combination of these materials.

The gate conductor 292 may further comprise dopants that are incorporated during or after deposition. In some embodiments, the gate conductor 292 may further comprise a workfunction setting layer (not shown) between the gate dielectric 290 and the gate conductor 292. The workfunction setting layer can be a workfunction metal (WFM). The gate conductor 292 and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

The replacement gate structure 289 may be formed by initially forming the gate dielectric layer within the gate opening 250 around the nanolayer channels 182, 186, and 190, upon sidewalls of the inner spacers 196, upon the gate spacers 154, and upon the top surface of the BDI region 152. The replacement gate structure 289 may further be formed by subsequently forming a gate conductor layer upon the gate dielectric layer. For clarity, the replacement gate structure 289 may be a wraparound gate structure, gate all around structure, since the gate conductor 292 wraps around the nanolayer channels 182, 186, and 190, as is depicted in the Y cross-section.

The gate conductor layer and gate dielectric layer may be patterned using conventional lithography and etch process to remove undesired portions and retain desired portion(s), respectively. The retained desired portion(s) of the gate conductor layer and gate dielectric layer may form the gate dielectric layer 290 and gate conductor 292 of the replacement gate structure 292. The etch process, or another subtractive removal technique, may remove undesired portions of replacement gate structure 289, such that a top surface of the replacement gate structure 289 is coplanar with the top surface of the semiconductor device 100.

In some implementations, the gate conductor 292 can be recessed below the top surface of the semiconductor device 100 and a dielectric gate cap (not shown) can be formed upon the recessed gate conductor 292.

Figure 9:
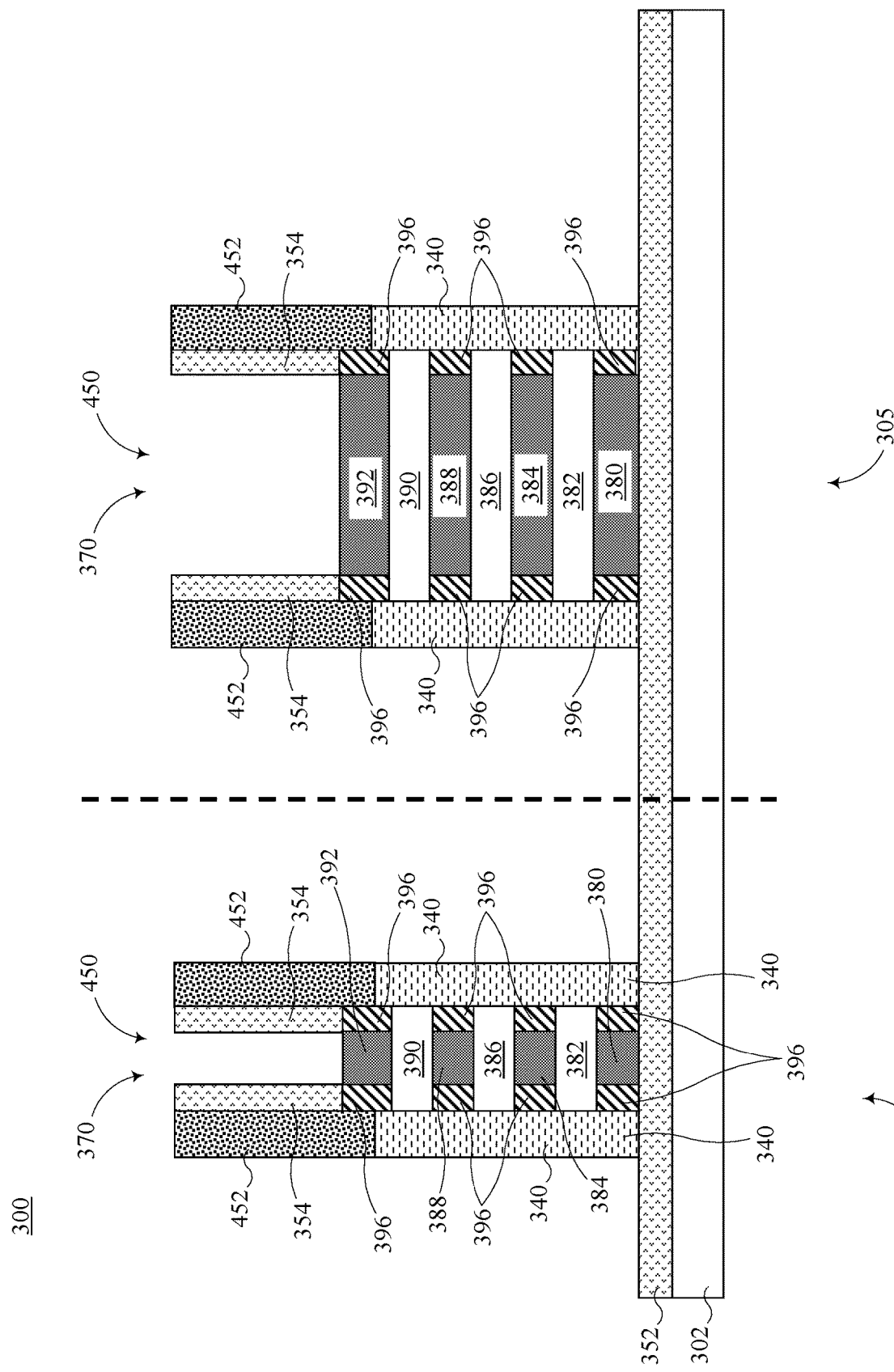
FIG. 9 through FIG. 14 depicts respective cross-sectional views of a semiconductor device that includes gate all around transistors with heterogeneous gate dielectric thicknesses, in accordance with one or more embodiments of the disclosure.

FIGS. 9-14 depict a semiconductor device 300 after various fabrication operations. For example, the semiconductor device 300 depicted in FIG. 9 may have previously undergone similar fabrication operations to those depicted in FIGS. 1-5. As depicted in FIG. 9, the semiconductor device 300 may include a substrate 302, a BDI region 352, a nanostructure stack 370, a S/D 340, a S/D cap 452, a sacrificial gate structure, and/or a gate spacer 354. The nanostructure stack 370 may include sacrificial nanolayer portions 380, 384, 388, and 392. The nanostructure stack 370 may further include nanolayer channels 382, 386, and 390. The nanostructure stack 370 may further include inner spacers 396.

For clarity, the substrate 302, the BDI region 352, the nanostructure stack 370, the S/D 340, the S/D cap 452, the sacrificial gate structure, and/or the gate spacer 354 may be formed of similar material(s) and by similar fabrication techniques described with reference to associated features of the semiconductor device 100.

The semiconductor device 300 may include a SG GAA FET 303 and a EG GAA FET 305. In accordance with embodiments of the disclosure, the SG GAA FET 303 is fabricated to include a relatively thin gate dielectric and the EG GA FET 305 is fabricated to include an effectively thick gate dielectric. As depicted, the EG GA FET 305 may include channels that have a greater channel length relative to associated channel lengths within the SG GAA FET 303.

The SG GAA FET 303 and the EG GAA FET 305 may be formed upon the same substrate 302 and/or BDI region 352. For clarity, the SG GAA FET 303 and the EG GAA FET 305 may be formed in the same region type (e.g., p-type region or n-type region) but may be formed in the same region location, or different region locations of the semiconductor device 300, as depicted.

When the SG GAA FET 303 and the EG GAA FET 305 are of the same type (e.g., p-type or n-type) The SG GAA FET 303 and the EG GAA FET 305 may utilize appropriate, similar, or same material(s), dopant(s), or the like, to form respective the S/D 340, replacement gate structures, thereof. When the SG GAA FET 303 and the EG GAA FET 305 are of different types (e.g., p-type or n-type) the SG GAA FET 303 and the EG GAA FET 305 may utilize appropriate or different material(s), dopant(s), or the like, to form respective the S/D 340, replacement gate structures, thereof.

FIG. 9 depicts cross-sectional views of the semiconductor device 300 shown after exemplary fabrication operation(s), in accordance with one or more embodiments. In the depicted fabrication stage, a gate opening 450 is formed.

The gate opening 450 may be formed by removing sacrificial gate structure and may expose at least respective sections of the upper surface of STI regions, respective sidewall surface sections of the BDI region 352, respective sidewall surface sections of sacrificial nanolayer portions 380, 384, 388, and 392, and respective sidewall surface sections of nanolayer channels 382, 386, and 390. In other words, gate opening 450 may expose the side surfaces of BDI 352, sacrificial nanolayer portions 380, 384, 388, and 392, and nanolayer channels 382, 386, and 390. The gate opening 450 may further expose the top surface of the sacrificial nanolayer portion 392. The gate opening 450 may further expose at least an inner portion or inside facing portion of a gate spacer 354.

Figure 10:
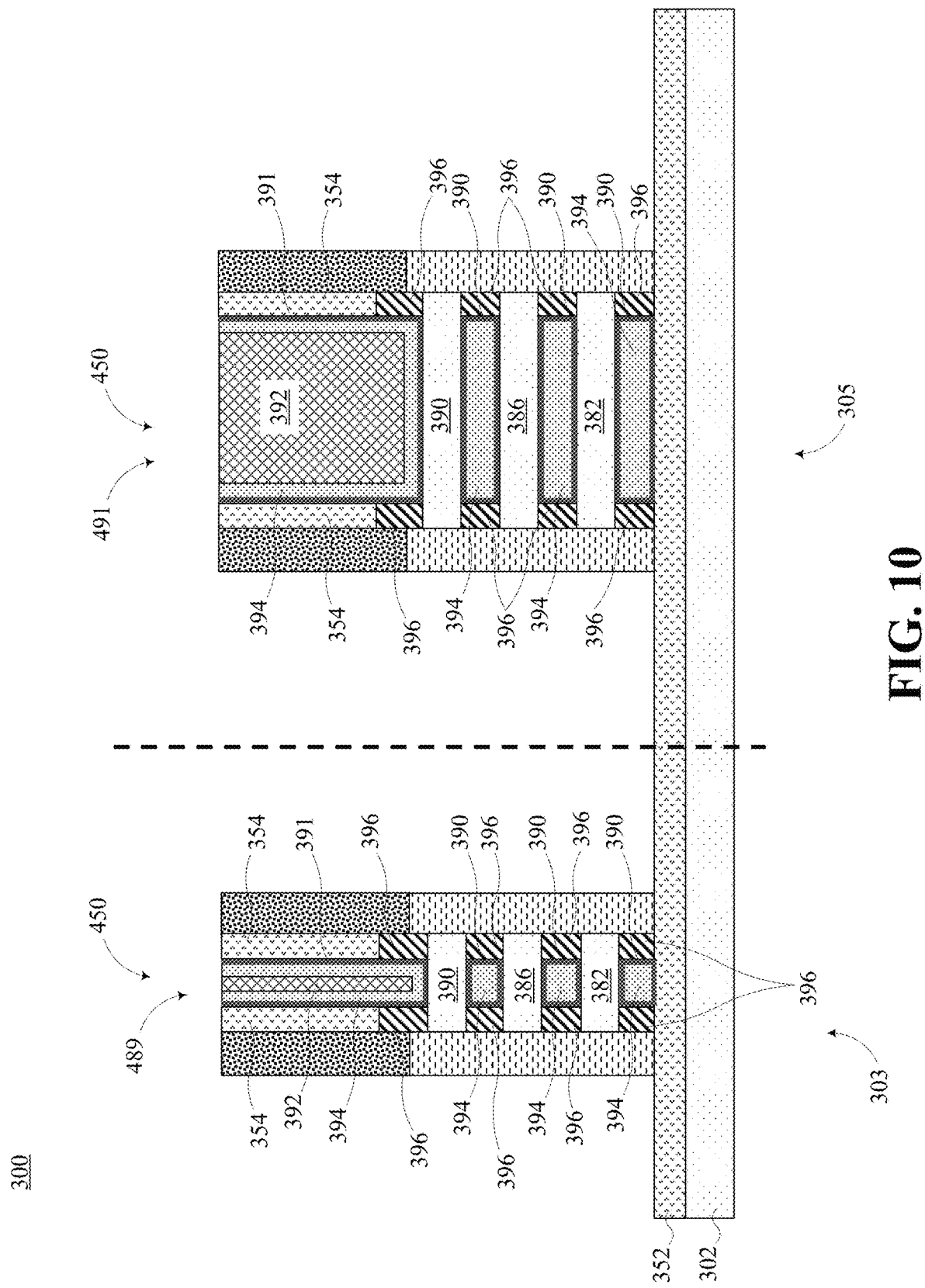

FIG. 10 depicts cross-sectional views of the semiconductor device 300 shown after exemplary fabrication operation(s), in accordance with one or more embodiments. In the depicted fabrication stage, the nanostructure stack 370 of the SG GAA FET 303 and the nanostructure stack 370 of the EG GAA FET 305 is processed by selectively removing the sacrificial nanolayer portions 380, 384, 388, and 392 therein. Subsequently, in the depicted fabrication stage, a replacement gate structure 489 is formed within the gate opening 450 of the SG GAA FET 303 around the nanolayer channels 382, 386, and 390 and a replacement gate structure 491 is formed within the gate opening 450 of the EG GAA FET 305 around the nanolayer channels 382, 386, and 390.

Various techniques may be utilized to process the nanostructure stack 370 of the SG GAA FET 303 and the nanostructure stack 370 of the EG GAA FET 305 to selectively remove the respective sacrificial nanolayer portions 380, 384, 388, and 392 therein. For example, a first gate opening 450 may laterally, or otherwise, expose the nanostructure stack 370 of the SG GAA FET 303 and second gate opening 450 may laterally, or otherwise, expose the nanostructure stack 370 of the EG GAA FET 305. Subsequently, the exposed sacrificial nanolayer portions 380, 384, 388, and 392 may be removed to expose the associated nanolayer channels 382, 386, and 390. As depicted, upper, lower, and side surfaces of the nanolayer channels 382, 386, and 390 may be exposed inside or within the neighboring inner spacers 396.

In some implementations, the nanolayer channels 382, 386, and 390 may be trimmed by for example an etch or other selective removal process. The nanolayer channels 382, 386, and 390 may be trimmed to increase the vertical space between vertically adjacent nanolayer channels 382, 386, and 390, to prevent undesired merging of vertically adjacent nanolayer channels. The trimming of the nanolayer channels 382, 386, and 390 can be accomplished by a vapor phase etch process, controlled etch cycles, or the like.

Replacement gate structures 489, 491 include a gate dielectric 391 and the gate conductor 392. Gate dielectric 391 can comprise any suitable dielectric material, including but not limited to silicon oxide, silicon nitride, silicon oxynitride, high-k materials, or any combination of these materials. The gate dielectric 391 can be formed by any suitable deposition process or the like. In some embodiments, the gate dielectric 391 has a thickness ranging from 1 nm to 5 nm, although less thickness and greater thickness are also conceived.

The gate conductor 392 can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. Gate conductor 392 may further comprise dopants that are incorporated during or after deposition, as appropriate for inclusion within SG GAA FET 303, EG GAA FET 305, respectively.

In some implementations, replacement gate structures 489, 491 may further include may further comprise a work function conductor 394 between the gate dielectric 391 and gate conductor 392. The work function conductor 394 can be a work function metal (WFM). The gate conductor 392 and work function conductor 394 can be sequentially formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Replacement gate structures 489, 491 may be formed by respectively forming a gate dielectric layer within gate opening 450 around the nanolayer channels 382, 386, and 390, upon sidewalls of inner spacers 396, upon gate spacers 354, and upon the top surface of BDI 352. Replacement gate structures 489, 491 may further be formed by subsequently forming a work function conductor layer upon the gate dielectric layer. The work function conductor layer may fill the remaining space between BDI 352 and nanolayer channel 382, may fill the remaining space between nanolayer channel 382 and nanolayer channel 386, and may fill the remaining space between nanolayer channel 386 and nanolayer channel 390, as depicted. Replacement gate structures 489, 491 may further be formed by forming a gate conductor layer upon the work function conductor layer filling the remaining gate opening 450. For clarity, replacement gate structures 489, 491 may be a wraparound gate structures, gate all around structures, since conductor(s) of the replacement gate structures 489, 491 wrap around the respective nanolayer channels 382, 386, and 390, respectively.

The gate conductor layer, work function conductor layer, gate dielectric layer may be patterned using conventional lithography and etch process to remove undesired portions and retain desired portion(s), respectively. The retained desired portion(s) of the gate conductor layer, work function conductor layer, and gate dielectric layer may form the gate dielectric layer 390, work function conductor 394, and gate conductor 392 of the replacement gate structures 489, 491, respectively. The etch process, or another subtractive removal technique, may remove undesired portions of replacement gate structures 489, 491 such that a top surface of replacement gate structures 489, 491 are coplanar with the top surface of semiconductor device 300.

Figure 11:
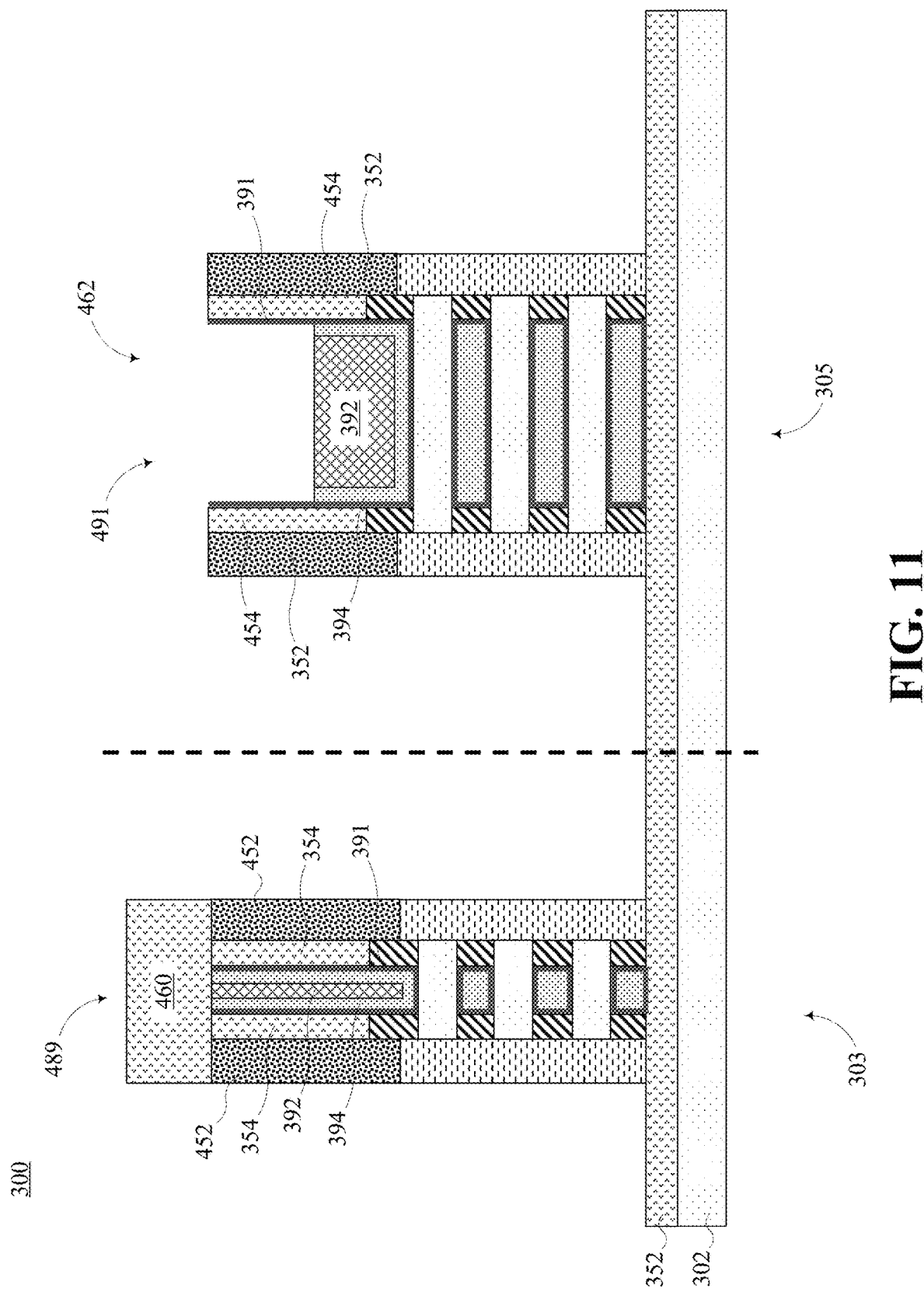

FIG. 11 depicts cross-sectional views of semiconductor device 300 shown after exemplary fabrication operation(s), in accordance with one or more embodiments. In the depicted fabrication stage, mask 460 is formed over SG GAA FET 303 and/or replacement gate structure 491 is partially recessed which forms a second gate opening 462.

Mask 460 may be a dielectric material, organic planarization material, or mask material, and may be formed by mask material deposition over at least SG GAA FET 303. The mask 460 material may be further deposited upon S/D caps 452, gate spacers 354, etc. associated with SG GAA FET 303. Mask 460 may be formed by depositing a blanket mask material over semiconductor device 300 and removing the blanket mask material that is located over EG GAA FET 305 while retaining the blanket mask material that is located over SG GAA FET 303. Mask 460 may protect SG GAA FET 303 from subsequent processing of replacement gate structure 491.

Replacement gate structure 491 may be partially recessed by using conventional lithography and etch processes. For example, the thickness or height of work function conductor 394 and gate conductor 392 of the replacement gate structure 491 is reduced by the partial recessing thereof, as depicted. After replacement gate structure 491 is partially recessed, a respective top surface of work function conductor 394 and gate conductor 392 may be coplanar. In a particular implementation, as depicted, the top surface of work function conductor 394 and gate conductor 392 may be located between the top and bottom surface of the surrounding gate spacer 454. The gate dielectric layer 390 may be retained as formed or otherwise maintained, such that a top surface of gate dielectric layer 390 is coplanar with the surrounding gate spacer 454. Alternatively, gate dielectric layer 390 may be partially recessed along with the other replacement gate structure 491 material(s). In this implementation, a respective top surface of each material of the replacement gate structure 491 may be coplanar.

Recessing the replacement gate structure 491 generally reduces the thickness of the replacement gate structure 491 such that one or more top surface(s) of the material(s) of replacement gate structure 491 (e.g., work function conductor 394 and gate conductor 392) is below the top surface of the surrounding semiconductor device 300 materials, such as gate structure 454. In this manner, the second gate opening 462 is formed between the top surface of the recessed replacement gate structure 491 and the top surface the surrounding semiconductor device 300 materials. In some embodiments, the thickness of replacement gate structure 491 is reduced by 10 nm to 30 nm, although a greater or lesser reduction is also conceived.

Figure 12:
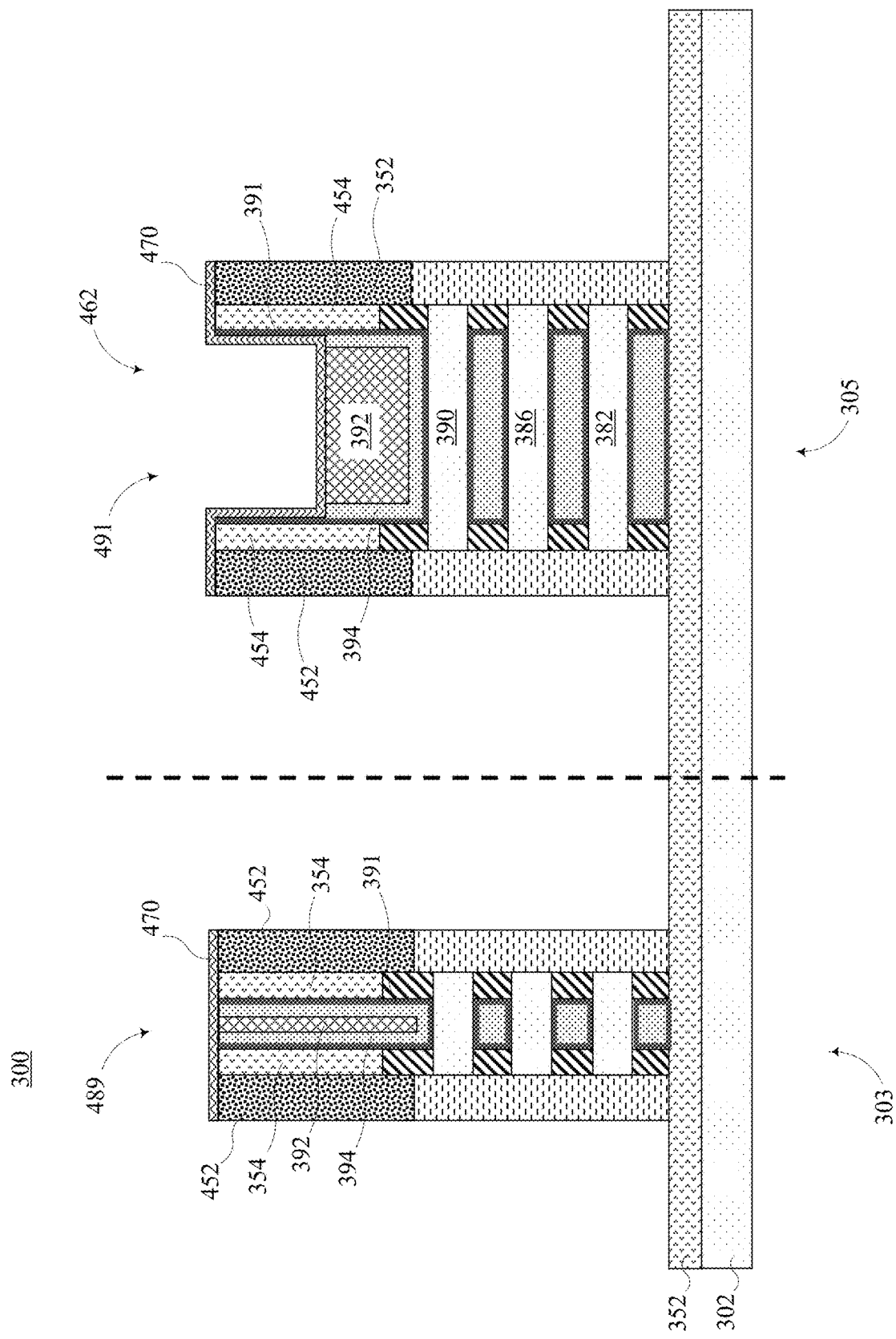

FIG. 12 depicts cross-sectional views of semiconductor device 300 shown after exemplary fabrication operation(s), in accordance with one or more embodiments. In the depicted fabrication stage, mask 460 is removed and gate dielectric layer 470 is formed over replacement gate structure 491 of EG GAA FET 305 within second gate opening 462. In some implementations, as depicted, gate dielectric layer 470 is formed over EG GAA FET 305 and SG GAA FET 303.

Gate dielectric layer 470 may be formed by depositing a blanket dielectric layer over EG GAA FET 305 within second gate opening 462 and over SG GAA FET 303. For example, gate dielectric layer 470 may be deposited over SG GAA FET 303 upon respective top surfaces of S/D cap 452, gate spacer 354, and replacement gate structure 489 and gate dielectric layer 470 may be deposited over EG GAA FET 305 upon the top surfaces of S/D cap 452 and gate spacer 354, upon the portions of gate dielectric layer 390 that are exposed in the formation of second gate opening 462, and upon the top surface(s) of the recessed replacement gate structure 491. In a particular implementation, the thickness of the gate dielectric layer 470 is chosen to achieve a predetermined or desired voltage drop from the gate conductor 395, depicted in FIG. 13, and the work function conductor 394 that wraps around the nanolayer channels 382, 386, and 390.

Gate dielectric layer 470 can comprise any suitable dielectric material, including but not limited to silicon oxide, silicon nitride, silicon oxynitride, high-k materials, or any combination of these materials. Gate dielectric layer 470 can be formed by any suitable deposition process or the like. In some embodiments, the gate dielectric 290 has a thickness ranging from 1 nm to 20 nm, although less thickness and greater thickness are also conceived. In an implementation, gate dielectric layer 470 is formed of the same material relative to gate dielectric 391. For example, gate dielectric layer 470 and gate dielectric 391 are formed of the same first high-k dielectric material (i.e., dielectric material with greater dielectric constant relative to silicon dioxide). In another implementation, gate dielectric layer 470 is formed of a relatively different dielectric material relative to gate dielectric 391. For example, gate dielectric 391 is formed of the first high-k dielectric material and gate dielectric layer 470 is formed a different second high-k dielectric material.

For clarity, at the present fabrication stage, second gate opening 462 remains or is otherwise present, after the formation of gate dielectric layer 470.

Figure 13:
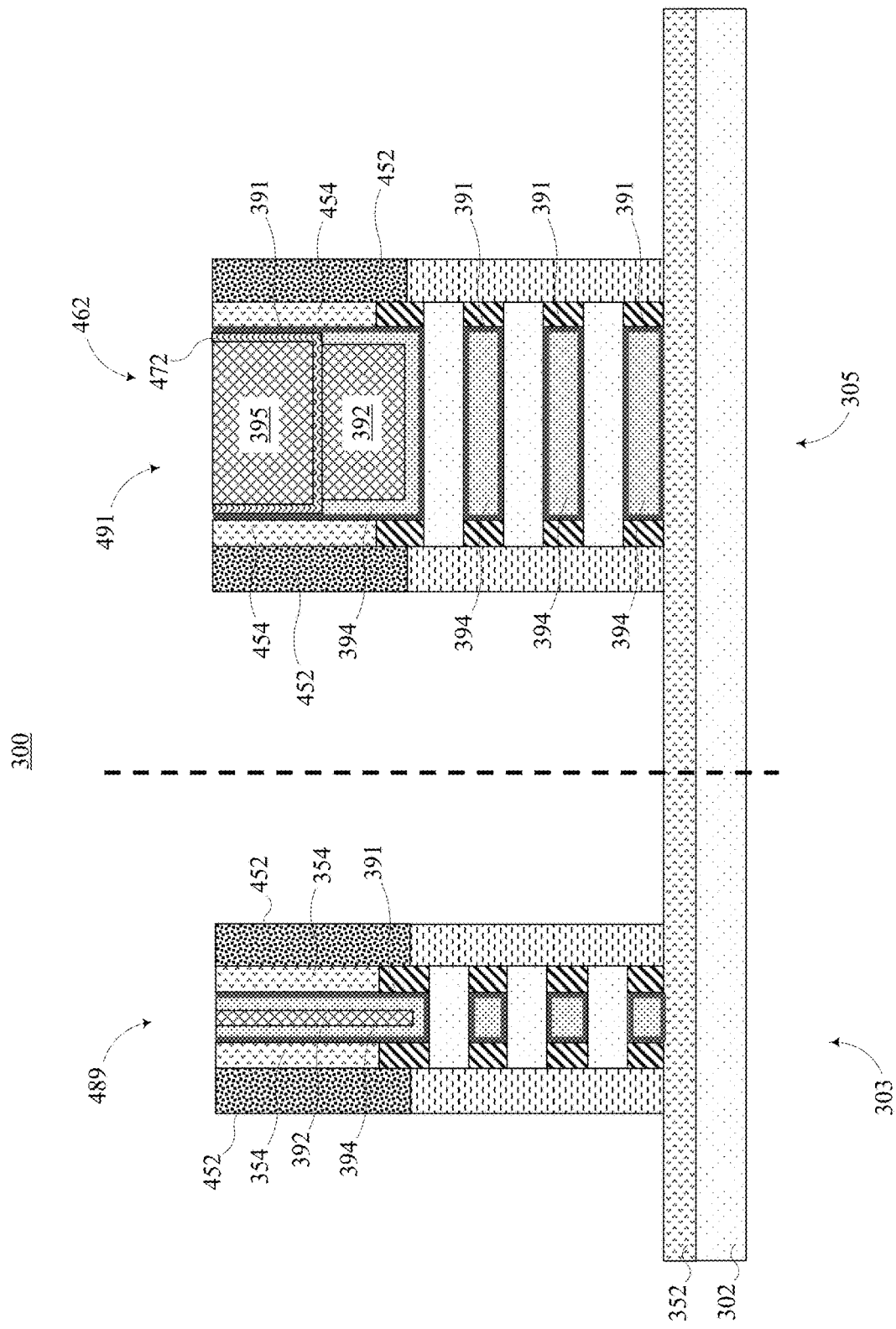

FIG. 13 depicts cross-sectional views of semiconductor device 300 shown after exemplary fabrication operation(s), in accordance with one or more embodiments. In the depicted fabrication stage, gate conductor 395 is formed upon gate dielectric layer 470 of replacement gate structure 491 within second gate opening 462 and excess or undesired gate dielectric layer 470 is removed.

Gate conductor 395 can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g., Ti3Al, ZrAl), TaC, TaMgC, carbon nanotube, conductive carbon, graphene, or any suitable combination of these materials.

Gate conductor 395 may further comprise dopants that are incorporated during or after deposition, as appropriate for inclusion within EG GAA FET 305. The gate conductor 395 can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Within replacement gate structure 491 of EG GAA FET 305, gate conductor 395 may be formed by depositing a gate conductor layer upon the gate dielectric layer 470, generally filling second gate opening 462. In some implementations, the gate conductor layer may be over deposited to fill the second gate opening 462 such that the top surface of gate conductor 395 is above the top surface of the other semiconductor 300 materials. Subsequently, a chemical mechanical polish (CMP) or other planarization process may remove excess gate conductor 395 material and/or excess gate dielectric layer 470 material and may generally planarize gate conductor 395 with the top surface of the other semiconductor device 300 materials. For example, respective top surfaces of S/D cap 452, gate spacer 354, replacement gate structure 489, and replacement gate structure 491 may be coplanar. After the CMP, the retained gate dielectric layer 470 may effectively form second gate dielectric 472 within replacement gate structure 491.

In a particular implementation, the material, thickness, and the like, of second gate dielectric 472 is chosen to achieve a predetermined or desired voltage drop across the gate conductor 395 and the work function conductor 394 that wraps around the nanolayer channels 382, 386, and 390 of replacement gate structure 491. In such implementations, current flow from gate conductor 395 into nanolayer channels 382, 386, and 390 is impeded sequentially (i.e., in series) by both the gate dielectric 472 and gate dielectric 391. The resistance of this current flow and the overall resistive effect of the gate dielectric EG GAA FET 305 effectively equates to the sum of the resistance of gate dielectric 472 and gate dielectric 391. In this manner, the embodiments of the disclosure provide for nominal or a lesser effective gate dielectric or gate dielectric resistance within SG GAA FET 303 and an increased or higher effective gate dielectric or gate dielectric resistance within EG GAA FET 305.

Figure 14:
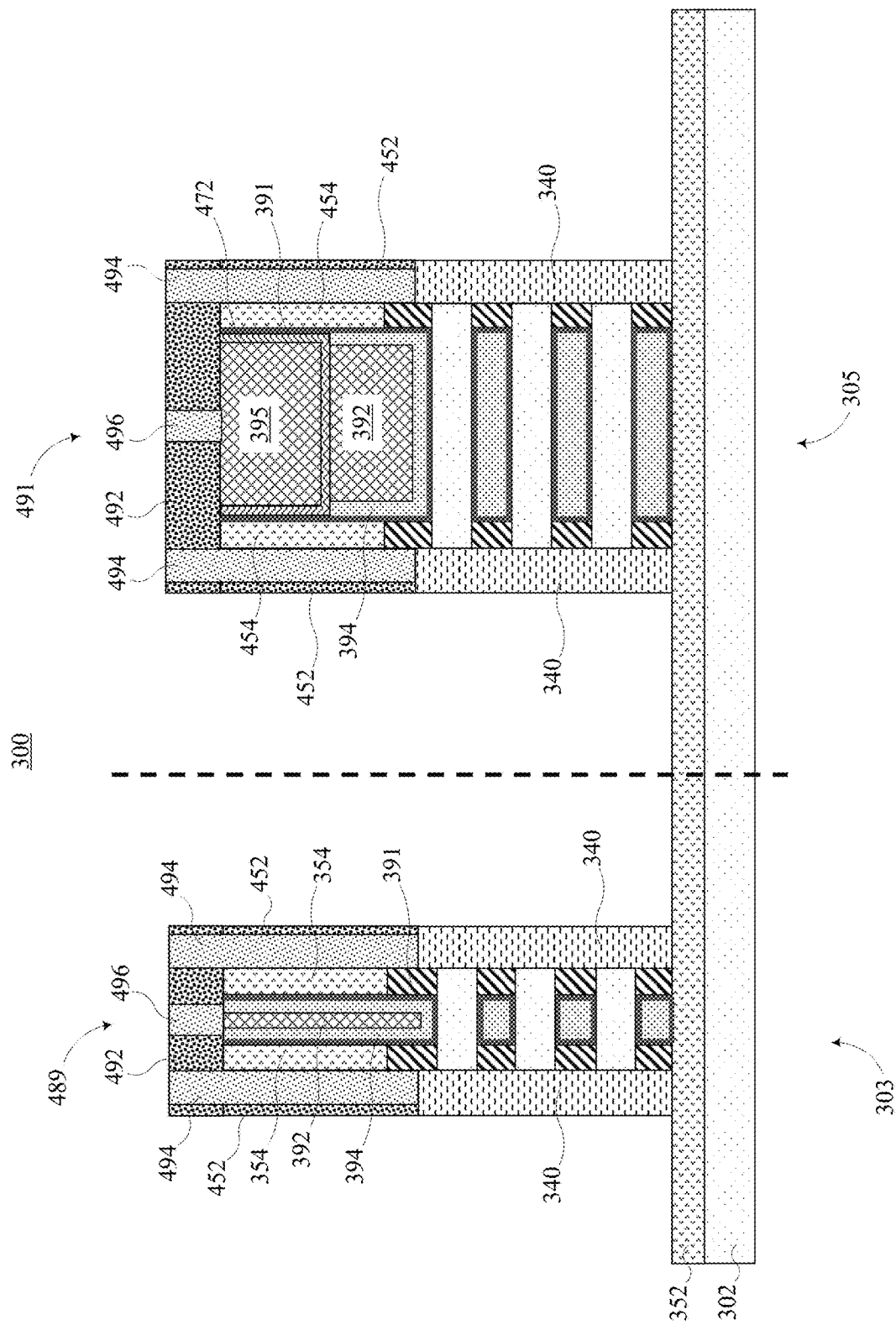

FIG. 14 depicts cross-sectional views of semiconductor device 300 shown after exemplary fabrication operation(s), in accordance with one or more embodiments. In the depicted fabrication stage, ILD 492 is formed upon S/D cap 452, upon gate spacer 354, upon replacement gate structure 489, and upon replacement gate structure 491, respective S/D contacts 494 are formed upon replacement gate structure 489 and upon replacement gate structure 491, and respective gate contacts 496 are formed upon replacement gate structure 489 and upon replacement gate structure 491.

ILD 492 may be any suitable dielectric material, including but not limited to silicon oxide, silicon nitride, silicon oxynitride, high-k materials, or any combination of these materials. ILD 492 can be formed by any suitable process or any suitable combination of multiple processes, including but not limited to, atomic layer deposition (ALD), chemical vapor deposition (CVD), physical vapor deposition (PVD), or the like.

ILD 492 may be formed upon respective top surfaces of S/D cap 452 associated with replacement gate structure 489 and associated with replacement gate structure 491. ILD 492 may further be formed upon respective top surfaces of gate spacer 354 associated with replacement gate structure 489 and associated with replacement gate structure 491. ILD 492 may be further formed upon respective top surfaces of gate dielectric 391, gate conductor 392, and/or work function conductor 394 of replacement gate structure 489. Similarly, ILD 492 may be further formed upon respective top surfaces of gate dielectric 391, gate dielectric 472, and gate conductor 395 of replacement gate structure 491.

In SG GAA FET 303 and in EG GAA FET 305, S/D contacts 494 may be formed by initially forming a S/D contact trench within ILD 492 and S/D cap 452. The S/D contact trench may expose a sidewall of gate spacer 354, may expose a sidewall portion of an upper inner spacer 396, and may further expose a portion of a respective top surface of S/D 340. Similarly, in SG GAA FET 303, gate contact 496 may be formed by initially forming a gate contact trench within ILD 492. The gate contact trench may expose a portion of, or the entire top surface, of replacement gate structure 489. For example, the gate contact trench may expose the top surface of gate conductor 392 and the top surface of work function conductor 394 of replacement gate structure 489.

In EG GAA FET 305, gate contact 496 may be formed by initially forming a gate contact trench within ILD 492. The gate contact trench may expose a portion of, or the entire top surface, of replacement gate structure 491. For example, the gate contact trench may expose a portion of the top surface of gate conductor 395.

Subsequently, one S/D contact 494 may be formed within each S/D contact trench by depositing conductive material within each of the S/D contact trenches and one gate contact 496 may be formed within each gate contact trench by depositing conductive material within each of the gate contact trenches.

S/D contact 494 and gate contact 492 may be formed by depositing electrically conductive material upon replacement gate structure 489 and upon replacement gate structure 491 filling respective contact trench(es). A CMP or other grinding technique may remove excess S/D contact 494 and gate contact 492 conductive material. This planarization may result in the upper surface of S/D contact 494 and gate contact 492 being coplanar with the upper surfaces of ILD 492. S/D contact 494 and gate contact 492 conductive material may be any generally conductive material that is used as an electrode, such as, for example, Tungsten, Platinum, Titanium Nitride, Tantalum Nitride, Titanium Aluminum Nitride, alloys thereof, or the like.

In some implementations, S/D contact 494 and/or gate contact 492 includes an internal conductive region and a conductive barrier layer(s) (not shown) lining sidewalls and bottom surfaces of the internal conductive region. The conductive barrier layer(s) may be formed of titanium, titanium nitride, tantalum, tantalum nitride, cobalt, a combination thereof, or the like. The internal conductive region may be formed of metals such as Copper, Aluminum, Tungsten, Cobalt, Tungsten, Platinum, Titanium Nitride, Tantalum Nitride, Titanium Aluminum Nitride, alloys thereof, or the like.

The formation of S/D contact 494 and/or gate contact 492 may include forming a blanket conductive barrier layer extending into respective S/D contact trenches and into respective gate contact trenches, depositing metal over the blanket conductive barrier layer, and performing a planarization process, such as a CMP process grinding process, to remove excess portions of the blanket conductive barrier layer and excess portions internal conductive region so that the top surfaces of the S/D contact 494 and/or gate contact 492 and ILD 492 are coplanar.

For clarity, semiconductor device 300 includes EG GAA FET 305 that includes first gate dielectric 391 and second gate dielectric 472 and includes SG GAA FET 303 that includes just the first gate dielectric 391. In EG GAA FET 305, first gate dielectric 391 and second gate dielectric 472 may be the same or different materials, such as the same or different high-k dielectric materials. The second gate dielectric 472 may be chosen to achieve a predetermined or desired voltage drop across the gate conductor 395 and the work function conductor 394 that wraps around the nanolayer channels 382, 386, and 390 of replacement gate structure 491. In such implementations, current flow from gate conductor 395 into nanolayer channels 382, 386, and 390 is impeded sequentially (i.e., in series) by both the gate dielectric 472 and gate dielectric 391. The resistance of this current flow and the overall resistive effect of the gate dielectric EG GAA FET 305 effectively equates to the sum of the resistance of gate dielectric 472 and gate dielectric 391. In this manner, the embodiments of the disclosure provide for nominal or a lesser effective gate dielectric or gate dielectric resistance within SG GAA FET 303 and an increased or higher effective gate dielectric or gate dielectric resistance within EG GAA FET 305.

Further, gate conductor 395 and gate conductor 392 may be referred herein as an upper gate conductor and a lower gate conductor, a first gate conductor and a second gate conductor, or the like. These descriptions of gate conductor 395 and gate conductor 392 generally define there being two electrical separate instances or nodes of gate conductor material that is separated by a resistor, such as gate dielectric 472 (e.g., there is current flow impedance been gate conductor 395 and gate conductor 392).

FIG. 15 depicts a flow diagram illustrating method 500 of fabricating semiconductor device 300, according to one or more embodiments of the present disclosure. The depicted fabrication operations of method 500 are illustrated and described above with reference to one or more of FIG. 9 through FIG. 14 of the drawings. With reference to method 500, semiconductor device 300 may have previously undergone fabrication operations like those depicted in one or more of FIG. 1 through FIG. 8. Method 500 depicted herein is exemplary. There can be many variations to the diagram or operations described therein without departing from the spirit of the embodiments. For instance, the operations can be performed in a differing order, or operations can be added, deleted or modified.

Method 500 may include forming a first replacement gate structure around a first nanostructure stack (block 502) and forming a second replacement gate structure around a second nanostructure stack (block 504). The first replacement gate structure includes a first gate dielectric, a work function conductor, and a first gate conductor and the second replacement gate structure includes the first gate dielectric, the work function conductor, and the first gate conductor. For example, replacement gate structure 489 and replacement gate structure 491 are formed. At the present stage of fabrication, each replacement gate structure 489 and replacement gate structure 491 may include the first gate dielectric 391, work function conductor 394, and first gate conductor 392.

At block 506, method 500 may include forming a mask over the first replacement gate structure. For example, mask 460 is formed over replacement gate structure 489. At block 508, the work function conductor and the first gate conductor of the second replacement structure are partially recessed to form a second replacement gate structure gate trench, while the first gate dielectric of the second replacement structure is maintained. For example, the thickness of first gate conductor 392 and work function conductor 394 of replacement gate structure 491 is reduced by partial removal thereof and first gate conductor 392 is maintained, thereby forming gate opening 462. At block 510, method 500 may include removing the mask over the first replacement gate structure. For example, mask 460 over replacement gate structure 489 is removed.

At block 512 and at block 514, method 500 may include forming a second gate dielectric layer over the first replacement gate structure and over the second replacement gate structure within the gate opening. For example, second gate dielectric layer 470 may be formed upon the first gate dielectric 390, upon the first gate conductor 392, and upon the work function conductor 394 of replacement gate structure 489 and may be further formed upon the first gate dielectric 390, upon the recessed first gate conductor 392, and upon the recessed work function conductor 394 within gate opening 462 of replacement gate structure 491.

At block 516, method 500 may include forming a second gate conductor upon the second gate dielectric layer within the second gate opening of the second replacement gate structure. For example, second gate conductor 395 is upon the second gate dielectric layer 470 within the gate opening 462 of the replacement gate structure 491. In some embodiments, a CMP or other planarization process may remove excess second gate dielectric layer material that is over the first replacement gate structure and that is over the second replacement gate structure while retaining the second gate dielectric layer material that was previously formed within the gate opening.

At block 518 and at block 520, method 500 may include forming a gate contact and forming respective source/drain contacts of the first replacement gate structure and forming a gate contact and forming respective source/drain contacts of the second replacement gate structure. For example, respective S/D contacts 494 are formed and are each in direct contact with a respective S/D 340 of replacement gate structures 489, 491, a gate contact 496 is formed and is in direct contact with conductor(s) (gate conductor 392, work function conductor 394, etc.) of replacement gate structure 489, and another gate contact 496 is formed and is in direct contact with conductor(s) (gate conductor 395, etc.) of replacement gate structure 491.

The descriptions of the various embodiments of the present disclosure have been presented for purposes of illustration but are not intended to be exhaustive or limited to the embodiments described. Many modifications and variations will be apparent to those of ordinary skill in the art without departing from the scope and spirit of the disclosure. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device comprising:
a substrate;
a first gate all around field effect transistor (GAA FET) upon the substrate and comprising a plurality of first nanostructure channels and a first gate structure that includes a first gate dielectric around the plurality of first nanostructure channels and a first gate conductor over the first gate dielectric; and
a second GAA FET upon the substrate and comprising a plurality of second nanostructure channels and a second gate structure that includes the first gate dielectric around the plurality of second nanostructure channels, the first gate conductor over the first gate dielectric, a second gate conductor over the first gate conductor, and a second gate dielectric between a top surface of the first gate conductor and a bottom surface of the second gate conductor, wherein a top surface of the first gate dielectric is above the top surface of the first gate conductor.

2. The semiconductor device of claim 1, wherein the first GAA FET further includes a first gate spacer around the first gate structure and wherein the second GAA FET further includes a second gate spacer around the second gate structure.

3. The semiconductor device of claim 2, wherein the first gate dielectric is between the first gate conductor and the first gate spacer within the first GAA FET.

4. The semiconductor device of claim 2, wherein the first gate dielectric is between the first gate conductor and the second gate spacer and the second gate dielectric is between the second gate conductor and the second gate spacer within the second GAA FET.

5. The semiconductor device of claim 2, wherein the first gate structure further includes a first work function conductor between the first gate dielectric and the first gate conductor.

6. The semiconductor device of claim 5, wherein the second gate structure further includes the first work function conductor between the first gate dielectric and the first gate conductor.

7. The semiconductor device of claim 6, wherein the second gate dielectric is between the first gate dielectric and the second gate conductor within the second GAA FET.

8. The semiconductor device of claim 1, wherein the first gate conductor is configured to receive a first voltage and the second gate conductor is configured to receive a second voltage, wherein the second voltage is greater than the first voltage.

9. The semiconductor device of claim 1, wherein the first gate structure comprises a first current impedance from the first gate conductor to the plurality of first nanostructure channels, wherein the second gate structure comprises a second current impedance from the second gate conductor to the plurality of second nanostructure channels, and wherein the second current impedance is greater than the first current impedance.

10. The semiconductor device of claim 1, wherein the plurality of first nanostructure channels and the plurality of second nanostructure channels are formed of the same material.

11. The semiconductor device of claim 1, wherein the plurality of first nanostructure channels each have a first channel length and wherein the plurality of second nanostructure channels each have a second channel length, wherein the second channel length is greater than the first channel length.

12. A semiconductor device comprising:
a substrate;
a low voltage gate all around field effect transistor (SG GAA FET) upon the substrate and comprising a plurality of first nanostructure channels and a first gate structure that includes a first gate dielectric around the plurality of first nanostructure channels and a first gate conductor over the first gate dielectric; and a high voltage gate all around field effect transistor (EG GAA FET) upon the substrate and comprising a plurality of second nanostructure channels and a second gate structure that includes the first gate dielectric around the plurality of second nanostructure channels, the first gate conductor over the first gate dielectric, a second gate conductor over the first gate conductor, and a second gate dielectric between a top surface of the first gate conductor and a top surface of the second gate conductor, wherein a top surface of the first gate dielectric is above the top surface of the first gate conductor.

13. The semiconductor device of claim 12, wherein the SG GAA FET further includes a first gate spacer around the first gate structure and wherein the EG GAA FET further includes a second gate spacer around the second gate structure.

14. The semiconductor device of claim 13, wherein the first gate dielectric is between the first gate conductor and the first gate spacer within the SG GAA FET.

15. The semiconductor device of claim 13, wherein the first gate dielectric is between the first gate conductor and the second gate spacer and the second gate dielectric is between the second gate conductor and the second gate spacer within the EG GAA FET.

16. The semiconductor device of claim 13, wherein the first gate structure further includes a first work function conductor between the first gate dielectric and the first gate conductor.

17. The semiconductor device of claim 16, wherein the second gate structure further includes the first work function conductor between the first gate dielectric and the first gate conductor.

18. The semiconductor device of claim 17, wherein the second gate dielectric is between the first gate dielectric and the second gate conductor within the EG GAA FET.

19. The semiconductor device of claim 12, wherein the first gate structure comprises a first current impedance from the first gate conductor to the plurality of first nanostructure channels, wherein the second gate structure comprises a second current impedance from the second gate conductor to the plurality of second nanostructure channels, and wherein the second current impedance is greater than the first current impedance.

20. A semiconductor device comprising:
a transistor comprising a plurality of nanostructure channels and a gate structure, the gate structure comprising:
  a first gate dielectric around the plurality of first nanostructure channels;
  a first work function conductor over the first gate dielectric;
  a first gate conductor upon the first work function conductor;
  a second gate conductor above the first gate conductor; and
  a second gate dielectric between a top surface of the first gate conductor and a bottom surface of the second gate conductor, wherein a top surface of the first gate dielectric is above the top surface of the first gate conductor.

* * * * *